(12) United States Patent
Taquet et al.

(10) Patent No.: US 12,401,824 B2
(45) Date of Patent: Aug. 26, 2025

(54) METHOD AND APPARATUS OF ENCODING/DECODING POINT CLOUD GEOMETRY DATA SENSED

(71) Applicant: Beijing Xiaomi Mobile Software Co., Ltd., Beijing (CN)

(72) Inventors: Jonathan Taquet, Beijing (CN); Sebastien Lasserre, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 18/719,981

(22) PCT Filed: Oct. 26, 2022

(86) PCT No.: PCT/CN2022/127724
§ 371 (c)(1),
(2) Date: Jun. 14, 2024

(87) PCT Pub. No.: WO2023/116188
PCT Pub. Date: Jun. 29, 2023

(65) Prior Publication Data
US 2025/0056041 A1    Feb. 13, 2025

(30) Foreign Application Priority Data

Dec. 20, 2021   (EP) ..................... 21306845

(51) Int. Cl.
*H04N 19/00*    (2014.01)
*H04N 19/169*   (2014.01)
(Continued)

(52) U.S. Cl.
CPC ......... *H04N 19/597* (2014.11); *H04N 19/169* (2014.11); *H04N 19/70* (2014.11)

(58) Field of Classification Search
CPC .... H04N 19/597; H04N 19/169; H04N 19/70; G06T 9/001; H03M 7/70
See application file for complete search history.

(56) References Cited

U.S. PATENT DOCUMENTS

2016/0132716 A1* 5/2016 Cheng ................... G06V 20/64
                                                                382/103
2016/0259052 A1* 9/2016 Kirmani ............... G10K 11/006
(Continued)

FOREIGN PATENT DOCUMENTS

WO   WO 2021084295 A1    5/2021
WO   WO 2021207499 A1   10/2021

OTHER PUBLICATIONS

Extended European Search Report issued in Application No. 21306845.5 dated Jun. 21, 2022, 13 pages.
(Continued)

*Primary Examiner* — Frank F Huang
(74) *Attorney, Agent, or Firm* — Finnegan, Henderson, Farabow, Garrett & Dunner, L.L.P.

(57) ABSTRACT

A method of encoding, into a bitstream, point cloud geometry data sensed by at least one sensor associated with a sensor index is provided, the point cloud geometry data being represented by ordered coarse points occupying some discrete positions of a set of discrete positions of a two-dimensional space, each coarse point being located within the two-dimensional space by an order index defined from a sensor index associated with a sensor that is able to sense a point of the point cloud represented by the coarse point and a sample index associated with a sensing time instant at which the point of the point cloud is sensed. The method includes: obtaining sensing coverage data (SCD) representative of at least one range of order indexes associated with sensed data; and encoding the sensing coverage data (SCD) into the bitstream.

19 Claims, 10 Drawing Sheets

(51) Int. Cl.
*H04N 19/597* (2014.01)
*H04N 19/70* (2014.01)

(56) References Cited

U.S. PATENT DOCUMENTS

2016/0367336 A1* 12/2016 Lv .......................... A61B 6/032
2017/0024874 A1* 1/2017 Pang .................... G06V 40/113
2020/0302639 A1* 9/2020 Park ........................ G06T 7/246

OTHER PUBLICATIONS

Adarsh K. Ramasubramonian, et al. (Qualcomm Inc.), "[G-PCC][New proposal] Laser index clipping in predictive geometry", International Organisation for Standardisation Organisation Internationale De Normalisation ISO/IEC JTC 1/SC 29/WG 7 Coding of Moving Pictures and Audio, ISO/IEC JTC 1/SC 29/WG 7 m55384, Online—Oct. 2020, 2 pages.

* cited by examiner

METHOD AND APPARATUS OF ENCODING/DECODING POINT CLOUD GEOMETRY DATA SENSED

CROSS-REFERENCE TO RELATED APPLICATION

This application is a US national phase of International Application No. PCT/CN2022/127724, filed on Oct. 26, 2022, which claims priority to and benefits of European Patent Application No. 21306845.5, filed Dec. 20, 2021, the entire contents of both of which are incorporated herein by reference.

FIELD

The disclosure generally relates to point cloud compression and, in particular to methods and apparatus of encoding/decoding point cloud geometry data sensed by at least one sensor.

BACKGROUND

The present section is intended to introduce the reader to various aspects of art, which may be related to various aspects of at least one embodiment of the disclosure that is described and/or claimed below. This discussion is believed to be helpful in providing the reader with background information to facilitate a better understanding of the various aspects of the disclosure.

As a format for the representation of 3D data, point clouds have recently gained traction as they are versatile in their capability in representing all types of physical objects or scenes. Point clouds may be used for various purposes such as culture heritage/buildings in which objects like statues or buildings are scanned in 3D in order to share the spatial configuration of the object without sending or visiting it. Also, it is a way to ensure preserving the knowledge of the object in case it may be destroyed; for instance, a temple by an earthquake. Such point clouds are typically static, colored and huge.

SUMMARY

According to a first aspect of the disclosure, there is provided a method of encoding, into a bitstream, point cloud geometry data sensed by at least one sensor associated with a sensor index, point cloud geometry data being represented by ordered coarse points occupying some discrete positions of a set of discrete positions of a two-dimensional space, each coarse point being located within the two-dimensional space by an order index defined from a sensor index associated with a sensor that may sense a point of the point cloud represented by said coarse point and a sample index associated with a sensing time instant at which the point of the point cloud may be sensed. The method comprises:
 obtaining a sensing coverage data representative of at least one range of order indexes associated with sensed data; and encoding said sensing coverage data into the bitstream.

According to a second aspect of the disclosure, there is provided a method of decoding, from a bitstream, point cloud geometry data sensed by at least one sensor associated with a sensor index, point cloud geometry data being represented by ordered coarse points occupying some discrete positions of a set of discrete positions of a two-dimensional space, each coarse point being located within the two-dimensional space by an order index defined from a sensor index associated with a sensor that may sense a point of the point cloud represented by said coarse point and a sample index associated with a sensing time instant at which the point of the point cloud may be sensed. The method comprises decoding a sensing coverage data from the bitstream.

According to a third aspect of the disclosure, there is provided an apparatus of encoding, into a bitstream, point cloud geometry data sensed by at least one sensor associated with a sensor index, the point cloud geometry data being represented by ordered coarse points occupying some discrete positions of a set of discrete positions of a two-dimensional space, each coarse point being located within the two-dimensional space by an order index defined from a sensor index associated with a sensor that is able to sense a point of the point cloud represented by the coarse point and a sample index associated with a sensing time instant at which the point of the point cloud is sensed,
 in which the apparatus includes a processor configured to:
  obtain a sensing coverage data (SCD) representative of at least one range of order indexes associated with sensed data; and
  encode the sensing coverage data (SCD) into the bitstream

BRIEF DESCRIPTION OF THE DRAWINGS

Reference will now be made, by way of example, to the accompanying drawings which show embodiments of the disclosure, and in which.

Similar reference numerals may have been used in different figures to denote similar components.

DETAILED DESCRIPTION

Figure 1:
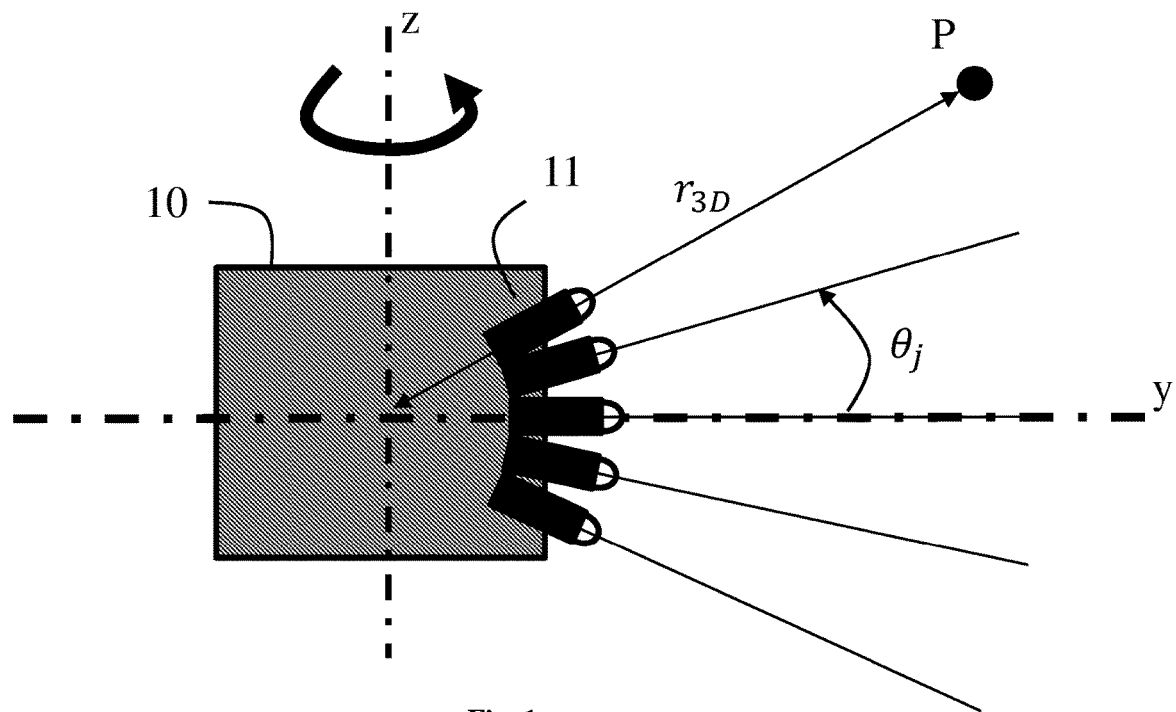
FIG. 1 shows schematically a side view of a sensor head and some of its parameters in accordance with the related art.

At least one of the embodiments is described more fully hereinafter with reference to the accompanying figures, in which examples of at least one of the embodiments are depicted. An embodiment may, however, be embodied in many alternate forms and should not be construed as limited to the examples set forth herein. Accordingly, it should be understood that there is no intent to limit embodiments to the particular forms disclosed. On the contrary, the disclosure is intended to cover all modifications, equivalents, and alternatives falling within the spirit and scope of the disclosure.

As a format for the representation of 3D data, point clouds have recently gained traction as they are versatile in their capability in representing all types of physical objects or scenes. Point clouds may be used for various purposes such as culture heritage/buildings in which objects like statues or buildings are scanned in 3D in order to share the spatial configuration of the object without sending or visiting it. Also, it is a way to ensure preserving the knowledge of the object in case it may be destroyed; for instance, a temple by an earthquake. Such point clouds are typically static, colored and huge.

Another use case is in topography and cartography in which using 3D representations allow for maps that are not limited to the plane and may include the relief. Google Maps is now a good example of 3D maps but uses meshes instead of point clouds. Nevertheless, point clouds may be a suitable data format for 3D maps and such point clouds are typically static, colored and huge.

Virtual Reality (VR), Augmented Reality (AR) and immersive worlds have recently become a hot topic and are foreseen by many as the future of 2D flat video. The basic idea is to immerse the viewer in a surrounding environment, in contrast to a standard TV that only allows the viewer to look at the virtual world in front of him/her. There are several gradations in the immersivity depending on the freedom of the viewer in the environment. A point cloud is a good format candidate for distributing VR/AR worlds.

The automotive industry, and more particularly foreseen autonomous cars, are also domains in which point clouds may be intensively used. Autonomous cars should be able to "probe" their environment to make good driving decisions based on the detected presence and nature of their immediate nearby objects and road configuration.

Depending on the use cases, point clouds may have from thousands to up to billions of points for cartography applications. Raw representations of point clouds require a very high number of bits per point, with at least a dozen of bits per cartesian coordinate x, y or z, and optionally more bits for the attribute(s), for instance three times 10 bits for the colors.

It is important in many applications to be able to either distribute point clouds to an end-user or store them in a server by consuming only a reasonable amount of bitrate or storage space, while maintaining an acceptable (or preferably very good) quality of experience. Efficient compression of these point clouds is a key point in order to make the distribution chain of many immersive worlds practical.

Compression may be lossy (like in video compression) for the distribution to and visualization by an end-user, for example on AR/VR glasses or any other 3D-capable device. Other use cases do require lossless compression, like medical applications or autonomous driving, to avoid altering the results of a decision obtained from the subsequent analysis of the compressed and transmitted point cloud.

Until recently, point cloud compression (aka PCC) was not addressed by the mass market and no standardized point cloud codec was available. In 2017, the standardization working group ISO/JCT1/SC29/WG11, aka Moving Picture Experts Group or MPEG, has initiated work items on point cloud compression. This has led to two standards, namely MPEG-1 part 5 (ISO/IEC 23090-5) or Video-based Point Cloud Compression (aka V-PCC)

MPEG-1 part 9 (ISO/IEC 23090-9) or Geometry-based Point Cloud Compression (aka G-PCC)

An important use case is the transmission of sparse geometry data sensed by at least one sensor mounted on a moving vehicle. This usually requires a simple and low latency embarked encoder. Simplicity is required because the encoder is likely to be deployed on computing units which perform other processing in parallel, such as (semi-) autonomous driving, thus limiting the processing power available to the point cloud encoder. Low latency is also required to allow for fast transmission from the car to a cloud in order to have a real-time view of the local traffic, based on multiple-vehicle acquisition, and take adequate fast decision based on the traffic information. While transmission latency can be low enough by using 5G, the encoder itself shall not introduce too much latency due to coding. Also, compression performance is extremely important since the flow of data from millions of cars to the cloud is expected to be extremely heavy.

Specific priors related to spinning Lidar-sensed sparse geometry data have been already exploited in G-PCC and have led to very significant gains of compression.

Figure 2:
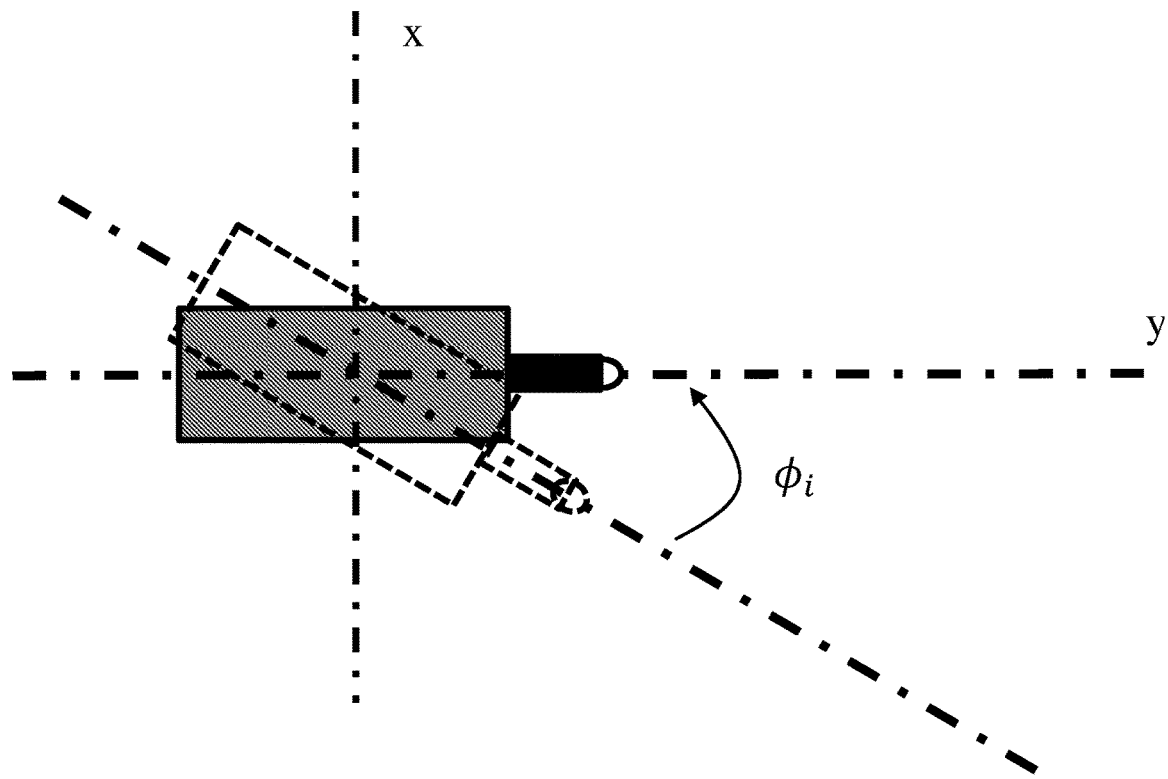
FIG. 2 shows schematically a top view of the sensor head and some of its parameters in accordance with the related art.

First, G-PCC exploits the elevation angle (relative to the horizontal ground) of sensing from a spinning Lidar head 10 as depicted on FIGS. 1 and 2. A Lidar head 10 comprises a set of sensors 11 (for example lasers), here five sensors are represented. The spinning Lidar head 10 may spin around a vertical axis z to sense geometry data of a physical object. Lidar-sensed geometry data is then represented in spherical coordinates ($r_{3D}$, $\phi$, $\theta$), where $r_{3D}$ is the distance of a point P from the Lidar head's center, $\phi$ is an azimuthal angle of the Lidar head's spin relative to a referential, and $\theta$ is an elevation angle of a sensor k of the spinning Lidar head 10 relative to a horizontal referential plane.

Figure 3:
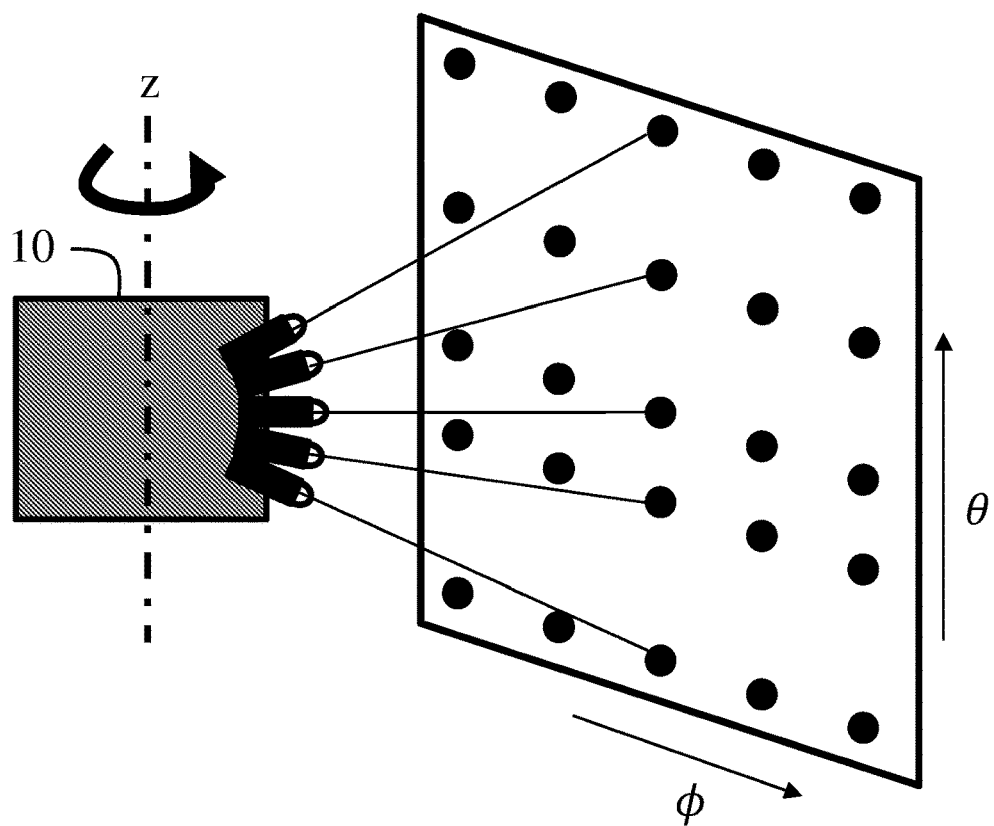
FIG. 3 shows schematically a regular distribution of data sensed by a spinning sensor head in accordance with the related art.

A regular distribution along the azimuthal angle has been observed on Lidar-sensed data as depicted on FIG. 3. This regularity is used in G-PCC to obtain a quasi 1D representation of the point cloud where, up to noise, only a radius $r_{3D}$ belongs to a continuous range of values while the angles $\phi$ and $\theta$ take only a discrete number of values $\phi_i \forall_i=0$ to I−1 where I is a number of azimuthal angles used for the sensing of the points and $\theta_j \forall_j=0$ to j−1 where J is a number of sensors of the spinning Lidar head 10. Basically, G-PCC represents Lidar-sensed sparse geometry data on a two-dimensional (discrete) angular coordinate space ($\phi$, $\theta$) as depicted on FIG. 3, together with a radius value $r_{3D}$ for each point.

This quasi 1D property has been exploited in G-PCC by predicting, in the spherical coordinate space, the location of a current point based on a precedingly coded point by using the discrete nature of angles.

Figure 4:
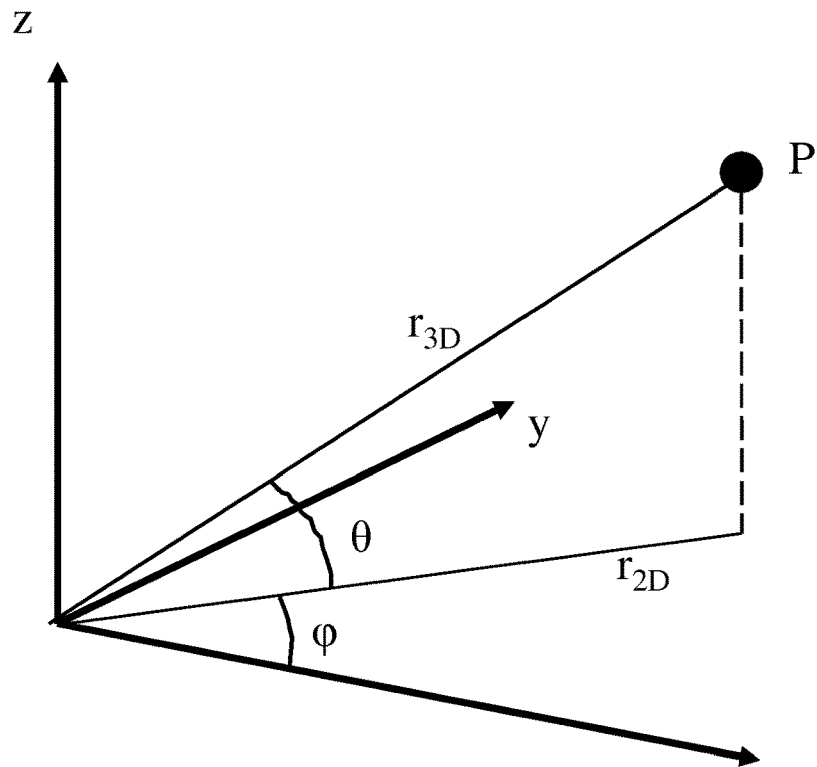
FIG. 4 shows schematically a representation of a point of a point cloud in a 3D space in accordance with the related art.

More precisely, the direct locations of points within a node are entropy encoded by using a context-adaptive entropy coder. Contexts are then obtained from the local conversion of the point locations into angular coordinates ($\phi$, $\theta$) and from the location of these angular coordinates relative to discrete angular coordinates ($\phi_i$, $\theta_j$) obtained from precedingly coded points. The predictive tree directly codes a first version of a point location in the angular coordinates ($r_2D$, $\phi$, $\theta$), where $r_2D$ is the projected radius on the horizontal xy plane as depicted on FIG. 4, using the quasi 1D nature ($r_2$, $\phi_i$, $\theta_j$) of this angular coordinate space. Then, spherical coordinates ($r_2D$, $\phi$, $\theta$) are converted into 3D cartesian coordinates (x,y,z) and a xyz residual is coded to tackle the errors of coordinate conversion, the approximation of elevation and azimuthal angles and potential noise.

Sensing sparse geometry data of point cloud by using spinning sensors head has some drawbacks and other types of sensor head may be used.

The mechanical parts generating the spin (rotation) of a spinning sensors head are prone to breakage and are costly. Also, by construction, the angle of view is necessarily 2π. This does not allow to sense a particular region of interest with high frequency, for instance it may be more interesting to sense in front of a vehicle than behind. Practically in most cases, when a sensor is attached to a vehicle, most of the 2-π angle of view is screened by the vehicle itself and the screened angle of view does not need to be sensed.

Figure 5:
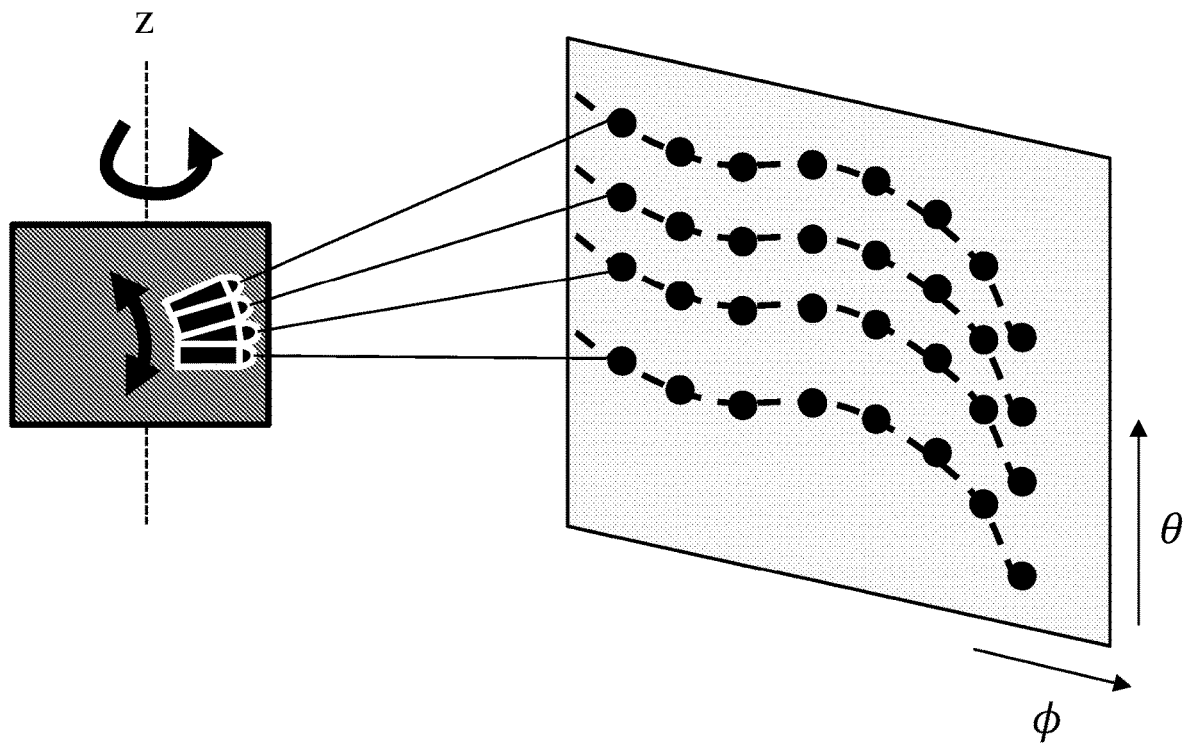
FIG. 5 shows schematically an example of a sensor head able to sense a real scene following a programmable sensing path in accordance with the related art.
Figure 6:
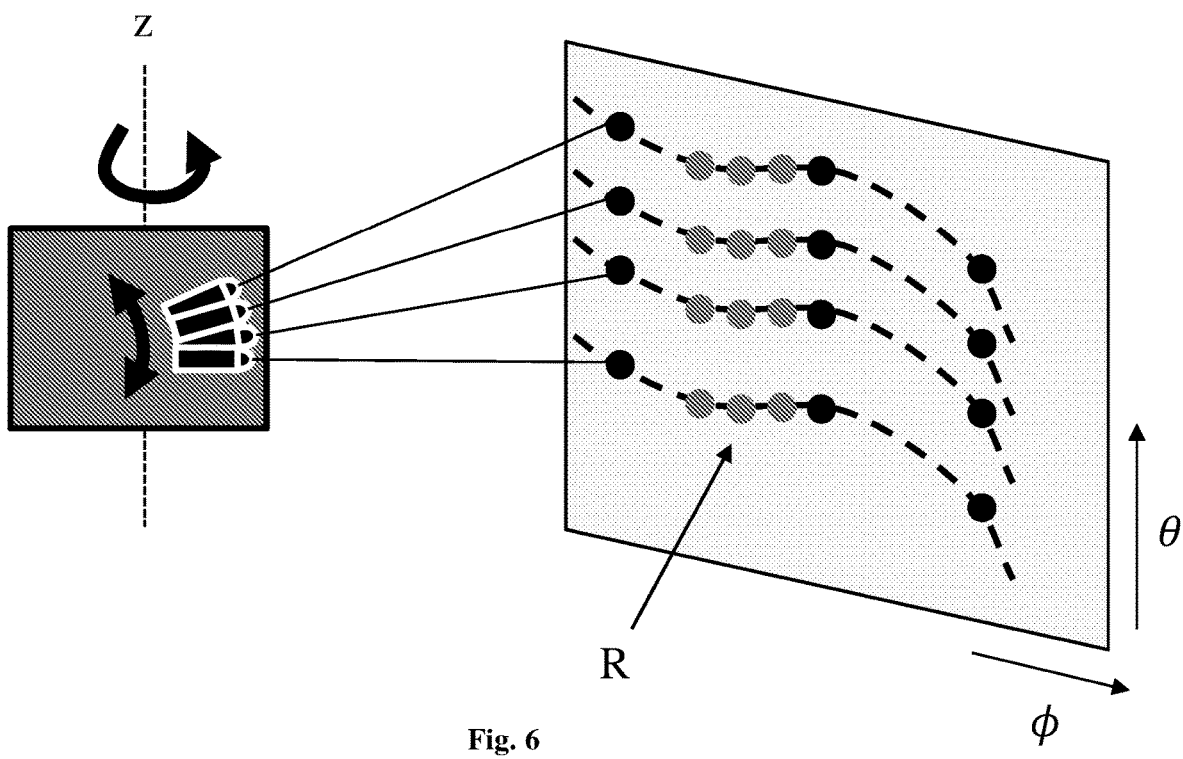
FIG. 6 shows schematically an example of a sensor head able to sense a real scene following a programmable sensing path according to different sensing frequencies in accordance with the related art.

New types of sensors, namely parametric sensors, have emerged recently, allowing for a more flexible selection of the region to be sensed. In most recent designs, a sensor can be more freely and electronically (thus avoiding fragile mechanical parts) moved to obtain a large variety of sensing path in the 3D scene as depicted on FIG. 5. On FIG. 5, a set of four sensors is shown. Their relative sensing directions, i.e. azimuthal and elevation angles, are fixed relative to each other, however they overall sense a scene following a programmable sensing path depicted by dashed lines on the two-dimensional angular coordinate ($\phi$,$\theta$) space. Points of the point cloud may then be sensed regularly along the sensing path. Some sensor head may also adapt their sensing frequency by increasing their sensing frequency when a region of interest R has been detected as illustrated on FIG. 6. Such a region of interest R may be associated with a close object, a moving object, or any object (pedestrian, other vehicle, etc.) precedingly segmented, for instance in a previous frame, or dynamically segmented during the sensing.

Figure 7:
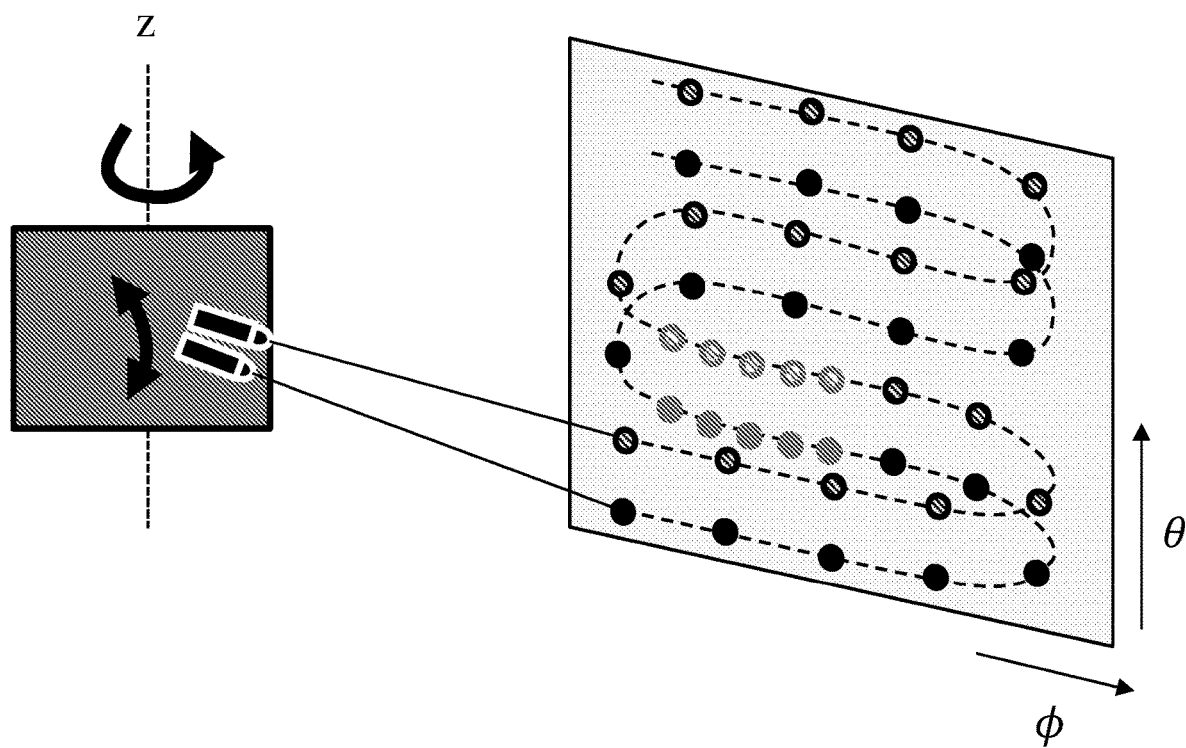
FIG. 7 shows schematically an example of a sensor head able to sense a real scene following a programmable zigzag sensing path according to different sensing frequencies in accordance with the related art.

FIG. 7 shows schematically another example of a sensing path (typical zigzag sensing path) used by a sensor head comprising two sensors able to increase their sensing frequencies when a region of interest has been detected (grey shaded points and grey hashed points). Using a zigzag sensing path may be advantageously used to sense a limited (azimuthal) angular sector of a 3D scene. Because sensors may be attached to a vehicle, their viewports of interest are necessarily limited by the presence of the vehicle itself that obstructs the scene, unless the sensors are located at the top of the car. Consequently, sensors with a limited probing angular sector are of high interest and easier to integrate to a vehicle.

Figure 8:
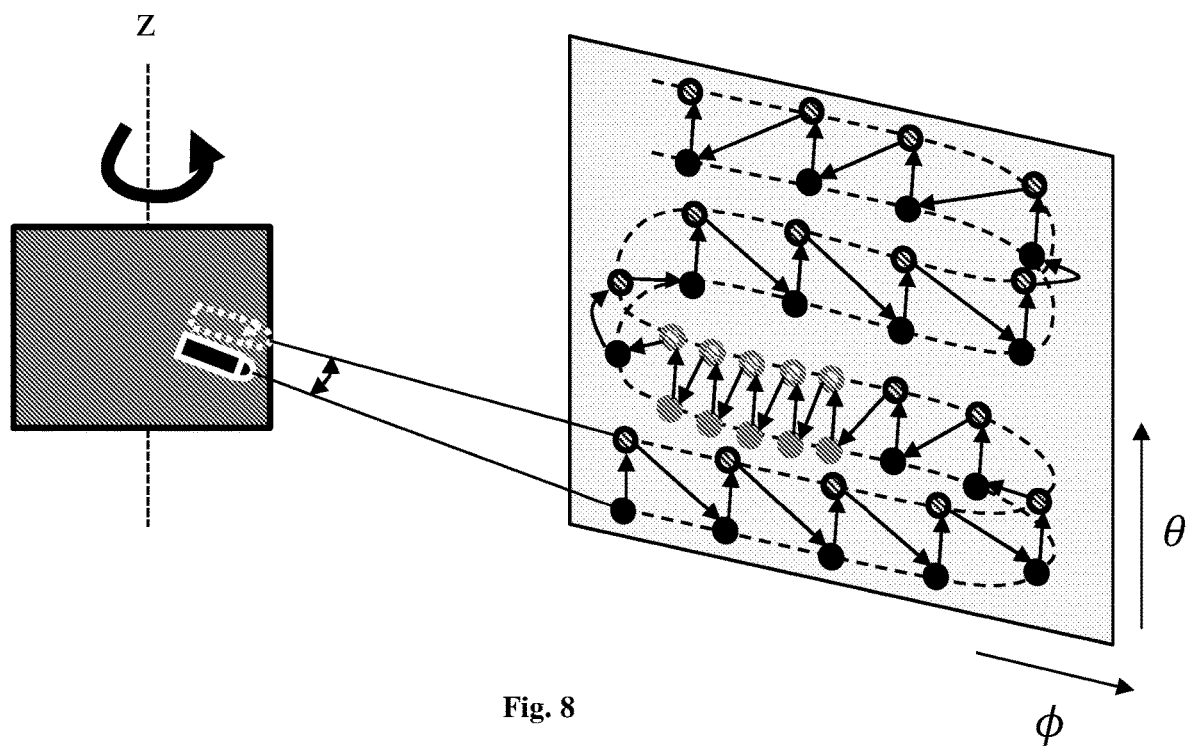
FIG. 8 shows schematically a single sensor head able to sense a real scene following a programmable zigzag sensing path according to different sensing frequencies.

As depicted on FIG. 8, a sensor head comprising a single sensor may also be used to sense multiple positions (two vertical positions on FIG. 8), for instance using reflections on mirrors oscillating with rotations (here vertical rotations). In that case, instead of using a set of sensors, a single sensor at different angular positions (i.e. with different elevation angle on FIG. 8) along a sensing path (here a zigzag sensing path) is used mimicking a sensing using a set of multiple sensors.

For the sake of simplicity, in the following descriptions and claims, the "sensor head" may refer to a set of physical sensors or a set of sensing elevation indexes mimicking a set of sensors as well. Also, one skilled in the art will understand that "a sensor" could also refer to a sensor in each sensing elevation index position.

In the working group ISO/IEC JTC 1/SC 29/WG 7 on MPEG 3D Graphics Coding, a codec named L3C2 (Low-Latency Low-Complexity Codec) is being considered to improve, relative to the G-PCC codec, the coding efficiency of Lidar-sensed point clouds. The codec L3C2 provides an example of a two-dimensional representation of the points of a point cloud namely a coarse representation. A description of the code can be found in the output document of the Working Group in N00167, ISO/IEC JTC 1/SC 29/WG 7, MPEG 3D Graphics Coding, "Technologies under Consideration in G-PCC", Aug. 31, 2021.

Basically, for each sensed point $P_n$ of the point cloud, a sensor index $\lambda_n$, associated with a sensor that sensed the point $P_n$ and an azimuthal angle $\lambda_n$, representing a sense angle of said sensor are obtained by converting 3D cartesian coordinates ($x_n$,$y_n$,$z_n$) representing the 3D location of the sensed point $P_n$. Points of the point cloud are then ordered based on the azimuthal angles $\phi_n$ and the sensor indices $\lambda_n$, for example, according to a lexicographic order based first on the azimuthal angle and then on the sensor index. The order index $o(P_n)$ of a point $P_n$ is then obtained by:

$$o(P_n) = \phi_n * K + \lambda_m$$

where K is the number of sensors.

Figure 9:
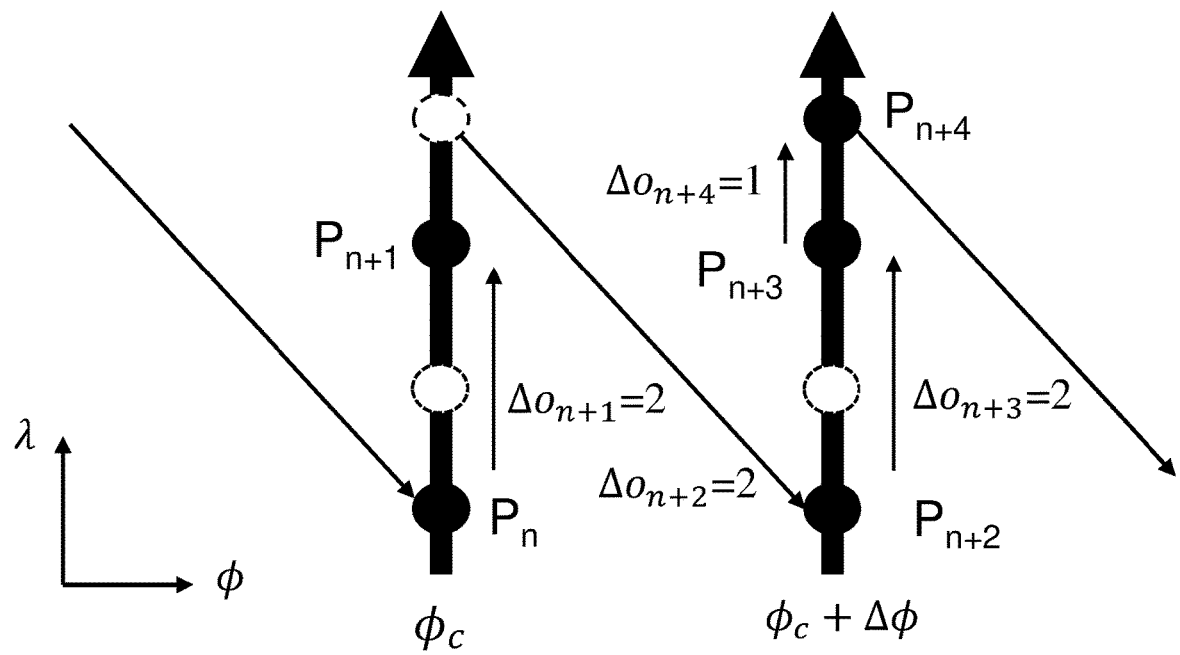
FIG. 9 shows schematically ordered coarse points of a coarse representation in accordance with at least one embodiment.

FIG. 9 shows schematically ordered coarse points of a coarse representation in accordance with at least one embodiment.

Five points of the point cloud have been sensed. Each of these five points are coarsely represented by a coarse point (black point) in the coarse representation: two coarse points $P_n$ and $P_{n+1}$ represent two points of the point cloud sensed at time $t_1$ with an angular angle $\phi_c$, and three coarse points represent three points of the point cloud sensed at time $t_2$ with an angular angle $\phi_c+\Delta\phi$ where $\Delta\phi$ is an azimuthal angle elementary shift. A coarse point that represents a sensed point of the point cloud is namely an occupied coarse point and a coarse point that does not represent a sensed point of the point cloud is namely an unoccupied coarse point. Because the points of the point cloud are represented by occupied coarse points in the coarse representation, the order indices associated with the points of the point cloud are also the order indices associated with the occupied coarse points.

The coarse representation of the point cloud geometry data may then be defined in a two-dimensional coordinate $(\phi, \lambda)$ space.

The coarse representation may also be defined for any types of sensor head including spinning sensors or parametric sensors. The definition of the coarse representation is based on a sensing path defined from sensor characteristics in a two-dimensional angular coordinate $(\phi, \theta)$ space comprising an azimuthal coordinate $\phi$ representative of an azimuthal angle representing a sensing angle of a sensor relative to a referential and an elevation coordinate $\theta$ representative of an elevation angle of a sensor relative to a horizontal referential plane. The sensing path is used to sense the points of the point cloud according to ordered coarse points representing potential locations of sensed points of the point cloud. Each coarse point is defined from one sample index s associated with a sensing time instant along the sensing path and one sensor index $\lambda$ associated with a sensor.

Figure 10:
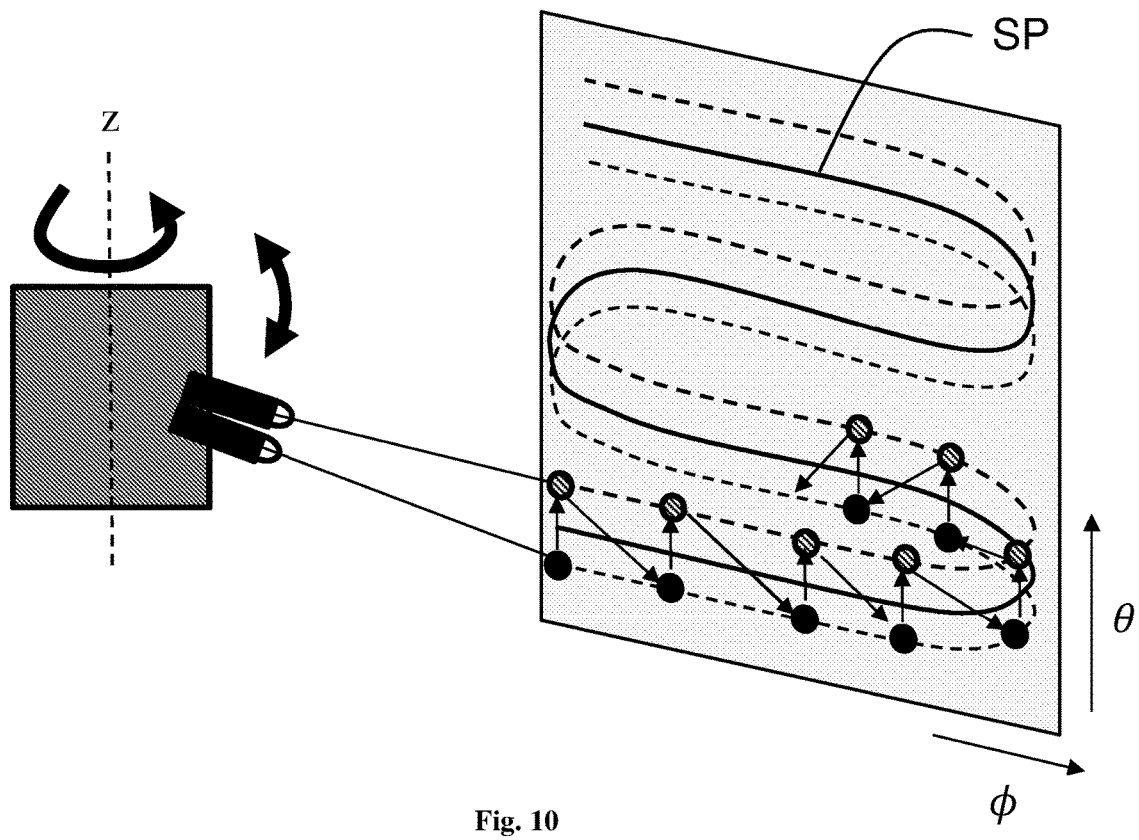
FIG. 10 shows schematically an example of an ordering of coarse points in accordance with one embodiment.
Figure 11:
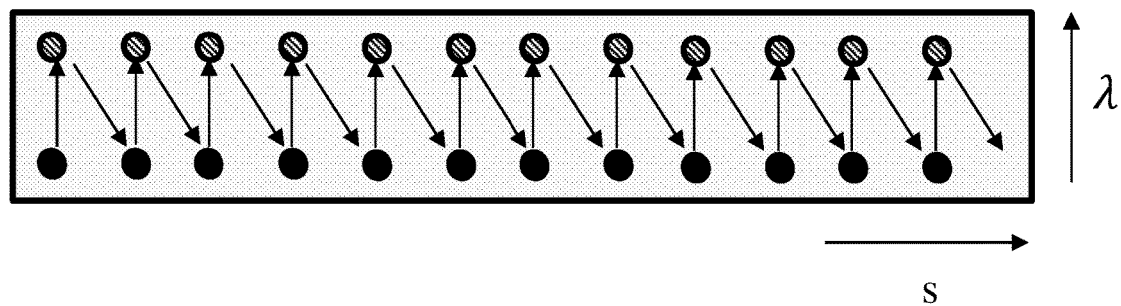
FIG. 11 shows schematically a representation of ordered coarse points in the two-dimensional coordinate (s,λ) space.

On FIG. 10, a sensor head comprising two sensors is used. The sensing paths followed by the two sensors are represented in dash lines. For each sample index s (each sensing time instant), two coarse points are defined. The coarse points associated with the first sensor are represented by black shaded points on FIG. 10 and the coarse points associated with the second sensor are represented by a black hashed point. Each of these two coarse points belongs to a sensor sensing path (dashed line) defined from the sensing path SP. FIG. 11 shows schematically a representation of ordered coarse points in the two-dimensional coordinate (s, $\lambda$) space. Arrows on FIGS. 10 and 11 illustrate the links between two successive ordered coarse points.

An order index o(P) is associated with each ordered coarse point according to the rank of said coarse point among the ordered coarse points:

$$o(P) = \lambda + s*K$$

where K is the number of sensors of a set of sensors or the number of different positions of a single sensor for a same sample index, $\lambda$ is the sensor index of the sensor that sensed the point P of the point cloud at the sensing time instant s.

Figure 12:
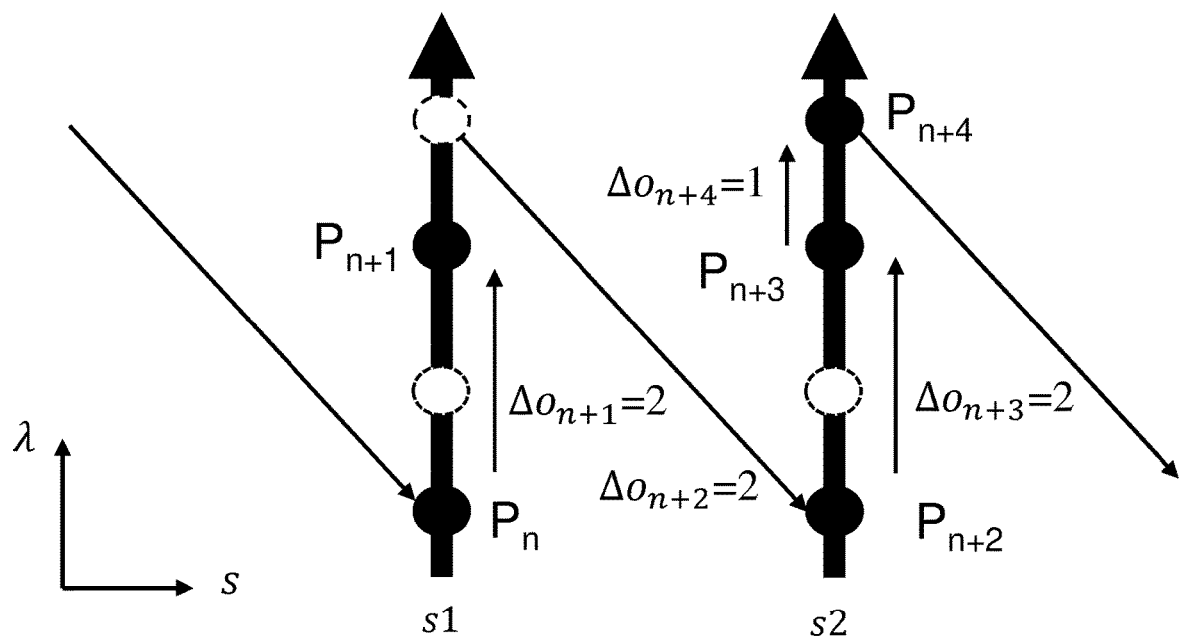
FIG. 12 shows schematically ordered coarse points of a coarse representation in accordance with at least one embodiment.

FIG. 12 illustrates ordered coarse points of a coarse representation in accordance with at least one embodiment.

Five occupied coarse points are represented (black circles): two coarse points $P_n$ and $P_{n+1}$, are occupied by two points of the point cloud sensed at a sensing time instant $t_1$ (corresponding to a sample index $s_1$) and three coarse points are occupied by three points of the point cloud sensed at a sensing time instant $t_2$ (corresponding to a sample index $s_2$).

The coarse representation of the point cloud geometry data may then be defined in a two-dimensional coordinate (s,$\lambda$) space.

Given the order index $o(P_1)$ of the first coarse point occupied by the first sensed point of the point cloud, and order differences $\Delta o$, one can recursively reconstruct the order index o(P) of any occupied coarse point occupied by a sensed point P of the point cloud by:

$$o(P) = o(P_{-1}) + \Delta o$$

Encoding a coarse representation of point cloud geometry data comprises encoding the order differences $\Delta o$.

In the following, the disclosure is described by considering a coarse representation defined in the two-dimensional coordinate (s,$\lambda$) space. But the same may also be described for a coarse representation defined in the two-dimensional coordinate $(\phi, \lambda)$ space because a spinning sensor head, such as a Lidar head, provides a particular coarse representation defined in the two-dimensional coordinate (s,$\lambda$) space in which, at each sensing time instant, sensors of the sensor head probe an object and the sensed points correspond to occupied coarse point of the representation.

As above discussed, point cloud geometry data is represented by ordered coarse points occupying some discrete positions of a set of discrete positions of the two-dimensional coordinate (s,$\lambda$) space. Each occupied coarse point is then located within the two-dimensional coordinate (s,$\lambda$) space by a sensor index associated with a sensor that sensed a point of the point cloud associated with said occupied coarse point, and a sample index associated with a sensing time instant at which the point of the point cloud has been sensed.

Figure 13:
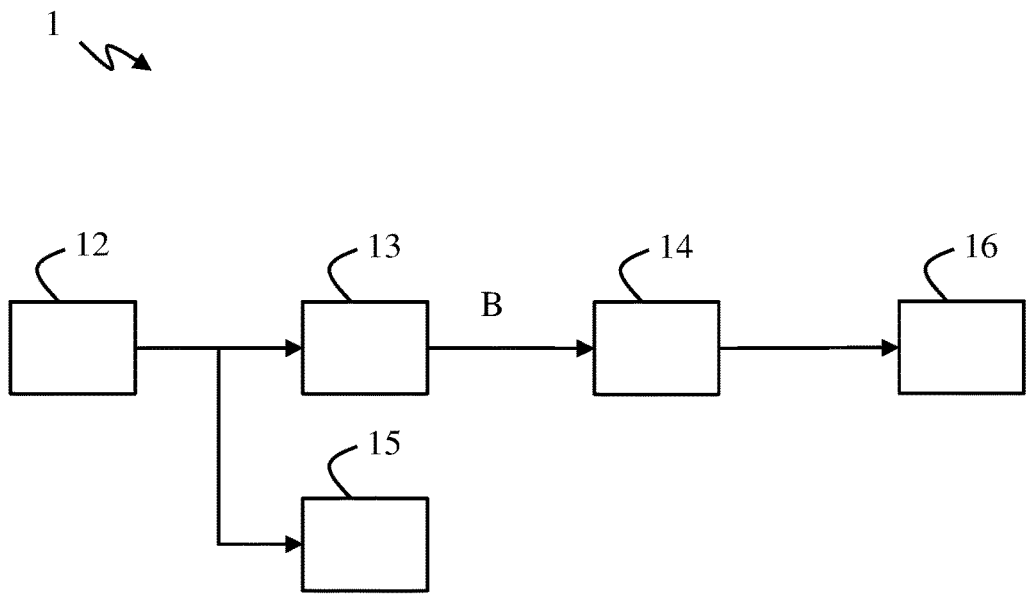
FIG. 13 shows schematically a system of a point cloud compression in automotive domain in accordance with the related art.

FIG. 13 shows schematically a system 1 of a point cloud compression in automotive domain in accordance with the related art.

The system 1 may comprise a sensor device 12, an encoder 13, a decoder 14 and, optionally, analytics device 15 and 16.

The sensor device 12, the encoder 13, the decoder 14 and, optionally the analytics devices 15 and 16 are connected though wireless or wired communications channels or more generally through communication networks.

The sensor device 12 may comprise a spinning sensor head or parametric sensor head that senses (captures) points (of objects) along time according to different sensing directions, i.e. along a sensing path or for different coordinates in the two-dimensional coordinate (s,$\lambda$) space. To perform points sensing, a sensor of the sensor device 12 sends electromagnetic/light signals in each sensing direction, and if a first object encountered in a given sensing direction is close enough, it returns a part of the signal to the sensor by reflecting it. The sensor can then estimate the distance to the object from the time difference between the sending and the receiving of the signal (corresponding to $r_{3D}$), and it can generate a point by providing sensed data comprising point geometry data (typically coordinates ($r_{3D}$,s,$\lambda$) or ($r_2$, $\phi$, $\theta$) or directly coordinates (x,y,z)) and other attributes like color, reflectance, acquisition timestamps, etc., for the given sensing direction (coordinates (s,$\lambda$)). The sensor may then (regularly or not) send sensed data by packets of points through a communication channel (for instance a transmission bus channel) or through a network to the encoder 13 and/or the analytics device 15. The encoder 13 may provide a bitstream B organized in several chunks (for example slices) and each chunk can be sent, through a second communication channel, as soon as it is available/ready (for low latency streaming) to the decoder 14. The decoder 14 may then decode the received chunks of the bitstream B and provide the decoded points of each chunk for example to the (real time) external analytics device 16.

There may be different reasons for having missing points in the point cloud either at the input of the encoder 13 or at the output of the decoder 14. For example, transmission failures may happen, either during the transmission of a packet of points between the sensing device 12 and the encoder 13 (or the analytics device 15) or during the transmission of a chunk of sensed data between the encoder 13 and the decoder 14.

In the best case, a packet of points or a chunk of sensed data which failed to be transmitted can be retransmitted later. In the worst case it is completely lost, and the sensed data in this packet of points or in this chunk are lost. The worst case may occur in low-latency transmission scenarios, where non reliable transmission protocols are used to improve the latency and allows dropping information which is too late (the information becoming too late mainly because of transmission/retransmission issues and retransmission latency).

In automotive applications, in the absence of points, it may be assumed that there is no object. This assumption may be wrong, and automatic decisions made based on this assumption can have dramatic consequences. For example, a self-driving car assuming that there isn't any object in a given area, because there is no sensed data received for that given area, becomes dangerous if there is no point because of a sensing failure or because of a transmission issue.

Sensors or point cloud codecs fail to provide solutions to indicate the reliability of not having sensed data for a given sensing direction: In G-PCC, a full "rotation" of the spinning sensors (or equivalently a complete sensing cycle of a parametric sensor along a sensing path), is assumed to provide a point cloud frame (instance): there is nothing to indicate if the sensor has really sensed all the sensing directions defined by a full rotation or the sensing path.

Moreover, for practical real-time applications, considering a complete "rotation" of the spinning sensor or a complete sensing cycle is not considered as a good practice: data sensed at the beginning of the rotation or path may become obsolete/too late if waiting for the complete frame to process it, because the acquisition takes time. Then it is better practice to process the data by chunks which may be available sooner. Similarly, there is currently nothing to indicate which "part" (mostly an angular section) of the full rotation or of the sensing path has really been covered by the sensor in a chunk/slice.

At least one embodiment of the disclosure has been devised with the foregoing in mind.

At least one of the aspects generally relates to point cloud encoding and decoding, one other aspect generally relates to transmitting a bitstream provided or encoded and one other aspects relates to receiving/accessing a decoded bitstream.

Moreover, the present aspects are not limited to MPEG standards such as MPEG-1 part 5 or part 9 that relate to the Point Cloud Compression, and may be applied, for example, to other standards and recommendations, whether pre-existing or future-developed, and extensions of any such standards and recommendations (including MPEG-1 part 5 and part 9). Unless indicated otherwise, or technically precluded, the aspects described in the disclosure may be used individually or in combination.

The disclosure relates to encoding/decoding point cloud geometry data sensed by at least one sensor associated with a sensor index based on a coarse representation of the point cloud as above discussed: the point cloud geometry data is represented by ordered coarse points occupying some discrete positions of a set of discrete positions of a two-dimensional space, each coarse point is located within the two-dimensional space by an order index defined from a sensor index associated with a sensor that may sense a point of the point cloud represented by said coarse point and a sample index associated with a sensing time instant at which the point of the point cloud may be sensed. The encoding method comprises obtaining a sensing coverage data representative of at least one range of order indexes associated with sensed data and encoding said sensing coverage data into the bitstream, and the decoding method comprises decoding a sensing coverage data from the bitstream.

The sensing coverage data is representative of one or multiple range(s) of order indexes of the coarse representation for which sensed data has been obtained by the sensor device. A range of order indexes may correspond to different sensing directions of sensors that provided sensed data.

If transmission errors occur between the sensing device and the encoder or if the encoder is configured to selectively remove some sensing directions from the point cloud, the encoder can indicate the missing or removed parts of the sensing coverage through the sensing coverage data. Also, even if transmission errors occur between the encoder and the decoder, the decoding method is able to determine the sensing coverage of the received (chunks of the) bitstream. The decoder can then provide this information to another application. The decoder may also decode the point cloud geometry data (and optionally other associated sensed data) for coarse points of the coarse representation whose order indexes belong to a range of order indexes indicated by the decoded sensing coverage data and for which sensed data have been received.

Encoding/decoding the sensing coverage data into/from a bitstream is also advantageous because a decoded sensing coverage data may then be used to indicate to analytics devices connected with the decoder (or to other devices or applications using the point cloud data or sensing coverage data) if sensed data are not provided in (e.g. missing from) the decoded point cloud (e.g. they have been lost during transmission). The sensing coverage data indicates the reliability of not having sensed data for a given sensing direction and thus may indicate if a sensor has sensed all the sensing directions defined by a full rotation of spinning sensor head or by following a complete sensing path. The sensing coverage data may be used to improve decisions taken by said local analytics devices. For example, the decoded sensing coverage data may improve automatic decisions made in automotive domain.

Encoding/decoding the sensing coverage data into/from a bitstream is also advantageous because it may reduce the energy consumption in a decoding application by allowing spatially locating chunks of the bitstream and thus allowing decoding only portion of a point cloud that are useful for a particular application. In one example, an application may exploit the sensing coverage data to guide the decoding process, by asking the decoder to only decode a subset of the received chunks. In another example, an application may receive several bitstream coming from several cars and use sensing coverage data to quickly locate chunks spatially and eventually select interesting chunks to decode them and fuse (parts of) the decoded point cloud information coming from different bitstream, to provide it to another application.

In variant, in order to improve the compression efficiency, the encoder/decoder may be guided by the sensing coverage data to encode/decode the point cloud. For instance, encoding/decoding point cloud geometry data and/or attributes data into/from the bitstream is based on the sensing coverage data, and so encoding/decoding the sensing coverage data into/from a bitstream is also advantageous because it may improve the compression of point clouds obtained from partially probed sensing path.

Figure 14:
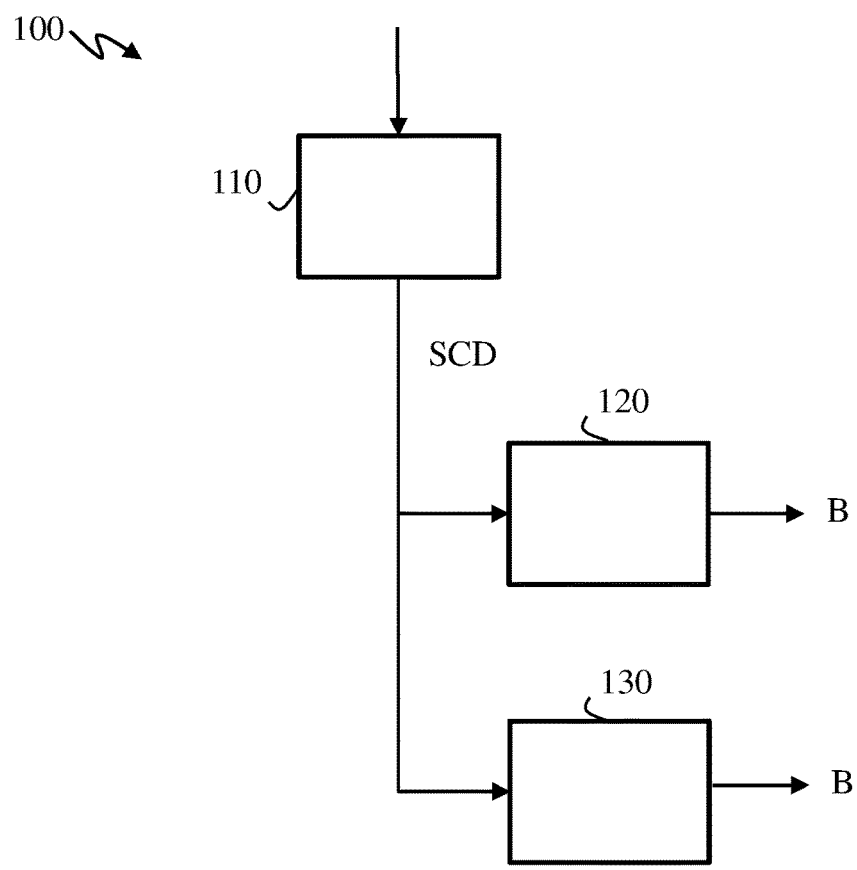
FIG. 14 shows schematically a schematic block diagram of steps of a method 100 of encoding point cloud geometry data into a bitstream of encoded point cloud data in accordance with at least one embodiment.

FIG. 14 shows a schematic block diagram of steps of a method 100 of encoding point cloud geometry data into a bitstream B of encoded point cloud data in accordance with at least one embodiment.

In step 110, a sensing coverage data SCD is obtained. The sensing coverage data SCD is representative of at least one range of order indexes associated with sensed data.

In step 120, the sensing coverage data SCD is encoded into the bitstream B.

In one embodiment, in step 130, point cloud geometry data is encoded into the bitstream B.

In variant, encoding (130) point cloud geometry data into the bitstream is based on the sensing coverage data SCD.

Figure 15:
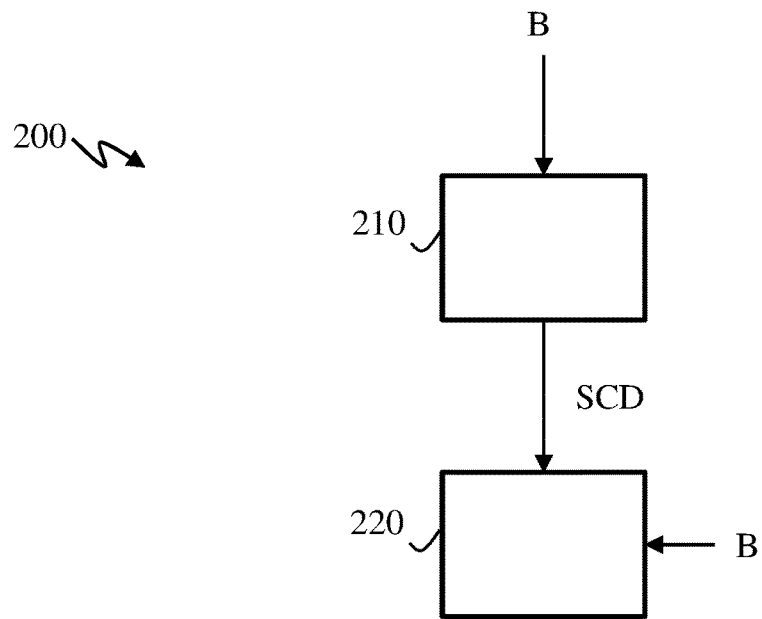
FIG. 15 shows a schematic block diagram of steps of a method 200 of decoding point cloud geometry data from a bitstream in accordance with at least one embodiment.

FIG. 15 shows a schematic block diagram of steps of a method 200 of decoding point cloud geometry data from a bitstream in accordance with at least one embodiment.

The decoding method 200 is straightforwardly deduced from the encoding method 100.

In step 210, a sensing coverage data SCD is decoded from the bitstream B.

In one embodiment, in step 220, point cloud geometry data is decoded from the bitstream B.

In variant, decoding (220) point cloud geometry data from the bitstream is based on the sensing coverage data SCD.

In one embodiment of step 110, the sensor device 12 sends packets of points to the encoder 13, and every packet of points contains packet sensing coverage data which allows to determine all the sensing positions that have been covered by the sensor during the sensing cycle of the points contained in the packet of points, even the positions for which no point has been detected. The sensing coverage data SCD may then be deduced by the encoder 13 from the packet sensing coverage data contained in the packets of points it has received and which were sent by the sensor device 12. The sensing coverage data SCD then exactly matches the sensing coverage of the sensor.

In variant the sensing coverage data SCD may be directly provided by the sensor device 12 and the encoder 13 receives the sensing coverage data SCD.

In one embodiment of step 110, the sensor device 12 sends packets of points to the encoder 13, in such a way that the exact packet sensing coverage data of every packet of points can be determined by the encoder 13. The sensing coverage data SCD may then be deduced by the encoder 13 from the packets of points that were sent by the sensing device 12 and which have been received.

In one example the sensor device 12 is a spinning lidar sensor and it sends packets of points to the encoder 13 corresponding to predetermined sensing parameters, for instance each packet sensing data for a predetermined sensing duration (1 ms for instance); or for a predetermined azimuthal angle rotation of the sensor (1° for instance); or for a predetermined number of sensing azimuthal angle steps (10 for instance); which permit the encoder 13 to determine the exact sensing coverage of each received packet of points. If packet(s) of points is/are lost between the sensing device 12 and the encoder 13, the encoder is able to determine that the packet has been lost and it may then determine the exact sensing coverage of the lost packets of points (or equivalently the exact sensing coverage of all the received packets of points).

For instance, each packet contains a sequence number (in the packet transmission header, defined by the protocol, for instance), and a lost packet can be determined by the encoder from a missing sequence number in the received packets.

This embodiment and its variants are advantageous because, even if transmission errors occur between the sensing device 12 and the encoder 13, the sensing coverage data SCD as obtained by the encoder 13 and as encoded by itself, is perfectly matching the effective sensing coverage of the sensor during the sensing cycle of the (partial) point cloud encoded by the encoder 13. Thus, it is more optimal to use it for letting analytics devices 15 or 16 taking decisions in comparison to using sensing coverage data SCD estimated by the encoder as below discussed.

In one embodiment of step 110, the sensing coverage data SCD may be estimated and provided by the encoder 13 only based on sensed data received from the sensing device 12.

This embodiment is advantageous because it allows using sensor device 12 without ability to create the sensing coverage data SCD, or without ability to provide sufficient information to produce a sensing coverage data SCD exactly matching the sensing coverage, or for which no predetermined sensing parameter is available. Decision taken by analytics based on these estimated sensing coverage data SCD could be sub-optimal but would still be better than if no sensing coverage data SCD were provided to the analytics devices.

The sensing coverage SCD may be provided from data such as timestamps and/or ranges of time (i.e. time durations) relative to a sensing of sensed data associated with a single point of the point cloud or associated with a packet of points (possibly containing no point, if no object has been detected).

In an embodiment, the sensing coverage data SCD may be representative of a single range of order indexes associated with sensed data. The single range of order indexes is typically associated with coarse points representing a whole point cloud frame (i.e. a temporal instance of the point cloud).

This embodiment is advantageous because it supports the case where the whole sensed data for a point cloud frame represents an incomplete sensing cycle, e.g. an azimuthal rotation that is less than a complete turn or a partial sensing along a sensing path.

Figure 16:
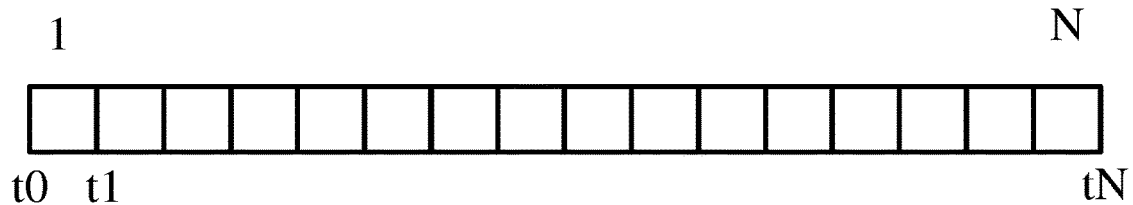
FIG. 16 shows an example of a sensing coverage data SCD represented by a single range of order indexes associated with sensed data in accordance with at least one embodiment.

FIG. 16 shows an example of a sensing coverage data SCD represented by a single range of order indexes associated with sensed data in accordance with at least one embodiment.

In this example, the sensing device 12 provides N packets of sensed data represented by white squares, each packet containing sensed data associated with points of a point cloud. A packet of sensed data may possibly contain no point if no points has been sensed. These sensed data may correspond to different sensors of the sensing device 12 with different sensing directions. For example, these N packets of sensed data may be obtained when the sensing device 12 is guided by a sensing path (parametric sensor head) or by azimuthal angles and orientation angles (spinning sensor head). For example, the sensed data determine point geometry data associated with a point or a packet of points. Each packet of sensed data 'i' is sent at a determined time stamp ti and contains all sensed data of the points sensed during the time interval [t(i−1), ti), starting from timestamp t(i−1) and until timestamp ti. In this example, the N packets of sensed data are sent for transmitting the sensed data of the points sensed during the time interval [t0, tN), each packet being sent at time stamps ti from t1 to tN. The length of packets and the number of points of the point cloud associated with the content of these packets may be equal or not. In the example, the first packet starts at a time stamp t0 and ends at the timestamp t1, the second packet starts at a time stamp t1 and ends at the timestamp t2, etc. In this example, all the sensors of the sensing device obtained sensed data for a complete sensing process (full rotation of a spinning sensor or a complete sensing path). The sensing coverage data SCD is representative of a single range of order indexes associated with sensed data between the timestamps t0 and tN.

Figure 17:
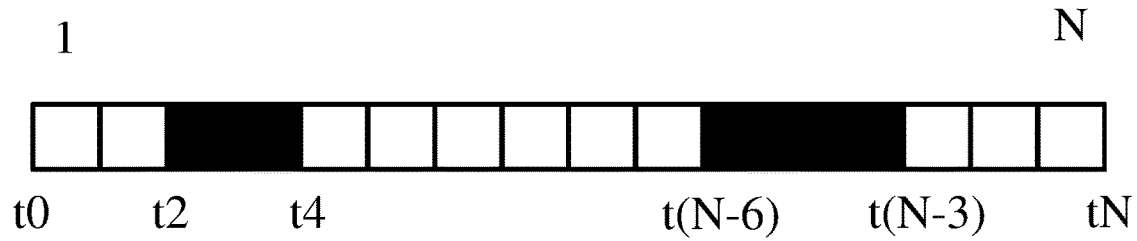
FIG. 17 shows an example of a sensing coverage data SCD of FIG. 16 after an unreliable transmission in accordance with at least one embodiment.

FIG. 17 shows an example of use of the sensing coverage data SCD of FIG. 16 after an unreliable transmission in accordance with at least one embodiment.

In this example, assuming that some packets of sensed data have been lost during transmission of sensed data of FIG. 16 (black squares), between the sensing device 12 and the encoder 13, the encoder may identify some transmission errors occurred and provides sensing coverage data SCD which may be used by a decoder to identify what are the order indexes for which the sensed data is not provided in the bitstream, for example the encoder may provide in the bitstream range of timestamps or order indexes associated with non-received packets of sensed data, or alternatively it may provide in the bitstream range of timestamps or order indexes associated with received packets of sensed data. In a variant, the encoder/decoder then do not encode/decode points' information for the coarse positions which corresponds to the range of timestamps or order indexes for which the sensed data is not provided in the bitstream. It allows reducing the bitstream size of the coarse representation.

In one embodiment, the sensing coverage data SCD may be representative of multiple ranges of order indexes associated with sensed data. Each range of order indexes is typically associated with coarse points representing a chunk (for example slice) of a point cloud frame.

On the encoder side, the union of the multiple ranges of order indexes corresponds to the sensing coverage data SCD of the point cloud frame.

On the decoder side, chunks are received for decoding. The sensing coverage data SCD may be obtained by grouping the decoded ranges of the order indexes. Thus, the decoder can easily support the loss of chunks. If chunks are lost, the union of the received chunks becomes a partially received point cloud, and the decoder is still able to determine all the order indexes of the partially received point cloud frame for which sensed data is lost: the sensing coverage data of the partially received point cloud frame just corresponds to the union of the sensing coverage data of every received chunks.

This embodiment is advantageous to support for unreliable transmission between the encoder 13 and the decoder 14. This embodiment is also well suited for low latency streaming with unreliable transmission.

This embodiment can also be used in the case where packets of sensed data are lost between the sensor 12 and the encoder 13. To inform the decoder 14 that sensed data are missing, the encoder may end a chunks/slice on the last order index covered by the sensor in the last received packet of sensed data preceding a packet loss and may start a new chunk/slice on the first order index covered by the sensor in the first received packet of sensed data following lost packet(s). The encoder 13 also indicates in the sensing coverage data SCD the multiple ranges of order indexes associated with sensed data corresponding to the encoded chunks/slices. For instance, in the example of FIG. 17, the encoder may encode a first chunk/slice containing the points sensed between timestamp t0 and t2, a second chunk/slice containing the points sensed between t4 and t(N−6) and a third chunk/slice containing the points sensed between t(N−3) and tN. The sensing coverage data SCD comprises a first range of order indexes associated with sensed data between the timestamps t0 and t2, a second range of order indexes associated with sensed data between the timestamps t4 and t(N−6) and a third range of order indexes associated with sensed data between the timestamps t(N−3) and tN.

Figure 18:
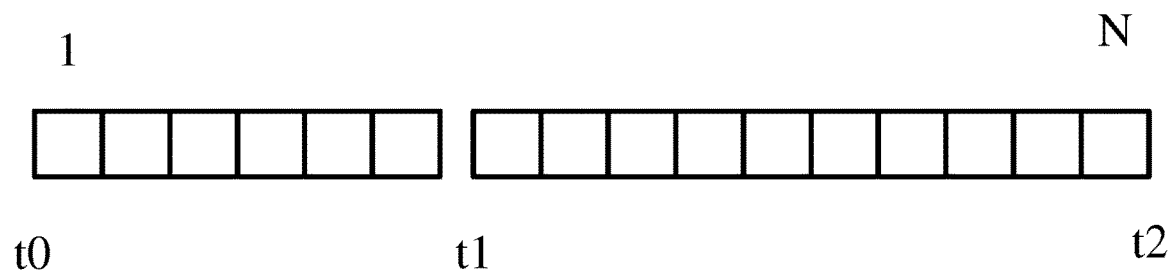
FIG. 18 shows an example of a sensing coverage data SCD represented by multiple ranges of order indexes associated with sensed data in accordance with at least one embodiment.

FIG. 18 shows an example of a sensing coverage data SCD represented by multiple ranges of order indexes associated with sensed data in accordance with at least one embodiment.

In the example of FIG. 18, the sensing coverage data SCD comprises a first range of order indexes associated with all the order indexes at which sensing has been performed between timestamps t0 and t1 and thus comprises the order indexes of the associated sensed data sensed between these two timestamps. The sensing coverage data SCD also comprises a second range of order indexes associated with sensed data sensed between the timestamps t1 and t2.

Figure 19:
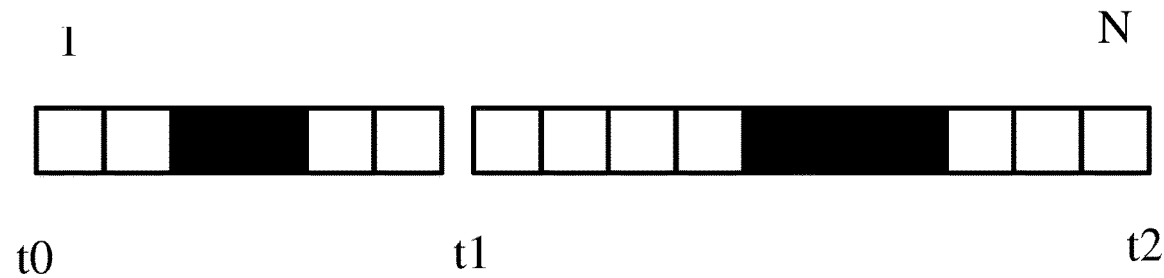
FIG. 19 shows an example of a sensing coverage data SCD of FIG. 18 after an unreliable transmission between the sensing device and the encoder in accordance with at least one embodiment.

FIG. 19 shows an example of a sensing coverage data SCD of FIG. 18 after an unreliable transmission between the sensing device 12 and the encoder 13 in accordance with at least one embodiment.

In this example, the encoder is configured to provide and send a first chunk/slice containing the sensed data acquired in the time interval [t0, t1) (corresponding to the first range of order indexes of the sensing coverage data SCD in FIG. 18) and a second chunk/slice for the time interval [t1, t2) (corresponding to the second range of order indexes of the sensing coverage data SCD in FIG. 18). Assuming that some sensed data have been lost during transmission of sensed data of FIG. 18 (black squares), the encoder 13 may identify some transmission errors occurred from the first range of order indexes of the sensing coverage data SCD and some transmission errors occurred from the second range of order indexes of the sensing coverage data SCD and may thus identify what are the ranges of missing order indexes for which the sensed data is lost (or missing because the sensor as not tried to sense them for instance). The encoder 13 can then include in the sensing coverage data SCD the ranges of missing order indexes. The encoder/decoder then do not encode/decode points for these missing order indexes. Moreover, each non received range of order indexes of the sensing coverage data SCD may be skipped or re-transmitted in a next chunk/slice (if they are received later by the encoder) according to bandwidth and/or latency constraints.

If the sensing coverage data SCD is compressed in the bitstream by using advanced compression technics (like context adaptive arithmetic coding, for instance and/or using dependencies on other compressed point cloud data), obtaining it may be too complex for some high-level applications that would only, for example, analyze the sensing coverage of an area made by several sensor heads (embedded in different cars for example). Therefore, the sensing coverage data SCD would generally have to be presented in easily parsed sections of the bitstream B. Also, for better support of low latency streaming the sensing coverage data SCD can be provided in headers of the chunks (for instance in the slice header of a G-PCC bitstream). In these bitstream sections, only simple parsing operations are usually admitted. In that case each chunk/slice header may contain the sensing coverage data SCD related to the chunk/slice itself.

Inside a chunk or point cloud frame, the order indexes which are not associated with sensed data mostly belong to one or several ranges of successive order indexes especially when a sensing has not been performed (e.g. sensor failure) or when sensed data has not been obtained (e.g. sensed data is not available because a packet of points has been lost between the sensor device 12 and the encoder 13).

In one embodiment, the sensing coverage data SCD may be representative of at least one range of order indexes which are not associated with sensed data, i.e. the ranges of order indexes for which sensing has not been performed or for which sensed data has not been obtained (i.e. ranges of missing order indexes).

This embodiment is advantageous because sensing coverage data SCD representative of at least one range of order indexes which are not associated with sensed data may generally be more compactly represented than a sensing coverage data SCD representative of at least one range of order indexes associated with sensed data: a range may be represented by a starting point (for instance a starting order index) and a length (for instance a number of order indexes). The cost for representing the starting point of a range of missing order indexes would generally be similar to the cost for representing the starting point of range of order indexes associated with sensed data. But one would expect that ranges of missing order indexes will be shorter than ranges of order indexes associated with sensed data, and so the cost for representing the length of the range, with variable length codes for instance, would be smaller for ranges of missing order indexes.

In variant, a flag may be used to let the possibility to the encoder 13 to choose between the two representations (range of order indexes which are not associated with sensed data or range of order indexes which are associated with sensed data) the one that is the less costly for representing its sensing coverage data SCD.

It may be noted that if the sensing coverage data SCD is representative of at least one range of order indexes associated with sensed data, the at least one range of order indexes that is not associated with sensed data can be easily deduced from the union of all the ranges of order indexes associated with sensed data of a complete sensing process (known beforehand) because said union of the range of ordered indices of the ranges associated with sensed data is the complement of the union of the ranges that are not associated with sensed data of a complete sensing cycle: knowing the first order index and the last order index of the complete sensing cycle, if one does the union of the ranges of one representation, all the gaps between the first order index and the last order index of the complete sensing cycle corresponds to the union of the other representation.

In one embodiment, each range of order indexes of the sensing coverage data SCD may be delimited by a lower bound LB and an upper bound UB.

In one variant, the lower bound LB may be the starting time of a sensing cycle and the upper bound UB may be the ending time of the sensing cycle. This may be used when the sensing cycle uses a sensing path for example. Starting and ending times may be defined from particular sample indices of a sensing path.

In one embodiment, the lower LB and upper UB bounds may be a starting and ending azimuthal angles of a sensing cycle using spinning sensor head.

In one embodiment, each range of order indexes of the sensing coverage data SCD may be delimited by a lower bound LB and an upper bound UB of order indexes.

In the following, only the sensing coverage data SCD comprising at least one range of order indexes will be discussed but all the embodiments and variants detailed below also apply if the sensing coverage data SCD comprises ranges of time or ranges of azimuthal angles instead of ranges of order indexes.

In variant, the lower LB and upper UB bounds may be encoded/decoded into/from the bitstream B as a starting order index S and an ending order index E.

In variant, the lower LB and upper UB bounds may be encoded/decoded into/from the bitstream B as the starting order index S and a number M of order indexes.

The ending order index E may be deduced by adding the starting order index S and the number M of order indexes or reciprocally the number M of order indexes may be obtained as a difference between the ending order index E and the starting order index S.

In variant, the starting order index S, the ending order index E or the number M of order indexes may be encoded/decoded into/from a slice header or into/from a geometry parameter set of the bitstream B.

In variant, the first order index S of a N-th point cloud frame or chunk referring to the geometry parameter set may be obtained by adding a starting order index S (for instance a frame sequence starting order index or a chunk sequence starting order index), present in the sequence parameter set or in the geometry parameter set (for example) to the result of the multiplication of a frame index or chunk index (e.g. N−1) by the number M of order indexes covered by a point cloud frame or by a chunk (as indicated in the sequence parameter set or in the geometry parameter set, for example): S+(N−1)*M. The last order index E of the point cloud frame or chunk can be obtained with the same approach by adding one to the point cloud frame index or chunk index and by subtracting one to the multiplication result: S+N*M−1.

This variant has the advantage of reducing the syntax needed to encode/decode the bounds LB and UB for every point cloud frame or chunk, but it has the drawback of imposing a constant number M of order indexes per frame or per chunk.

In variant, a binary data (flag), denoted for instance geom_constant_sensing_coverage_flag, may be encoded/decoded into/from the bitstream B, for example in the geometry parameter set, in order to select between a constant number M of order indexes or a number M of order indexes encoded/decoded for each point cloud frame or slice.

In one embodiment, the sensing coverage data SCD may further comprise a probing status associated with each order index of each range of order indexes. A probing status indicates if sensed data is associated with an order index of a range of order indexes.

This embodiment is advantageous because it better supports loss of isolated points of the point cloud frame or chunk between the sensing device 12 and the encoder 13 and could also be used if the sensor is able to report isolated sensing failures or uncertainties, or if the encoding application wants or needs to remove some isolated points.

In variant, the probing status may be encoded/decoded into/from the bitstream B, for example in the slice header, to add support of many isolated points' transmission errors between the sensing device and the encoder or many isolated sensing failures or uncertainties.

In variant, the sensing coverage data SCD and the probing status may be encoded/decoded into/from the bitstream B, for example in the slice header, on a per slice basis (i.e. the sensing coverage data SCD and the probing status in the slice header are representative of the sensing coverage data SCD of the slice itself). It is more efficient for low latency streaming and well suited for transmission errors between the encoder and the decoder.

In one embodiment, the probing status may be a probing flag that indicates if a sensed data is or not associated with an order index of a range of order indexes of the sensing coverage data SCD.

In variant, the probing flags may be entropy coded.

In one embodiment, the entropy coder is CABAC.

CABAC has the advantage of reducing the bitstream size, but it still requires coding sometimes too many probing flags and complexify the coding and decoding of each one of the flags.

In variant, the probing flags may be encoded/decoded using run-length encoding.

In variant, the probing flags may be grouped into words of binary data and the words may be encoded/decoded using variable length codes (like exp-Golomb or Huffman codes for example).

In variant, range(s) of order indexes which are not associated with sensed data may represent range(s) of order index for which either no point has been detected or probing result is unknown. Probing flags may then be encoded/decoded into/from the bitstream B only for order indexes that belong to range(s) of order indexes which are not associated with sensed data. A probing flag then indicates, if a given order index corresponds to no point detection of to an unknown probing result.

One advantage of this variant is that it reduces the number of probing status flags to be encoded/decoded. But the number of encoded/decoded probing status flags may remain too big. Moreover, the sensing order indexes associated with sensed data shall be obtained by decoding the bitstream before deducing probing status flags relative to order indexes associated with sensed data from the probing status flags relative to order indexes that are not associated with sensed data.

In variant, the lower and upper bounds of at least one range of order indexes associated with sensed data may be encoded/decoded into/from the bitstream B, and lower and upper bounds of the range of order indexes that are not associated with sensed data are deduced from decoded lower and upper bounds of at least one range of order indexes associated with sensed data, and also from a starting order index and an ending order index of a complete sensing process (known beforehand).

This variant is simpler to implement as it implies only making unions of ranges of order indexes associated with sensed data, rather than making a union of ranges of order indexes that are not associated with sensed data and removing this union from the union of all potential order indexes associated with sensed data of a complete sensing process (known beforehand).

In variant the starting order index and the ending order index are deduced from the lower and upper bounds of the union of the at least one range of order indexes associated with sensed data.

In one embodiment, a number of ranges of order indexes associated with sensed data within a chunk, a starting order index for a first range of order indexes associated with sensed data, and the length of the range (as a number of order indexes minus one) may be encoded/decoded in the bitstream B, preferably in the slice header.

Then for each other range of order indexes associated with sensed data within a chunk, an offset (minus one) from the end of a previous range and the length of the range is encoded/decoded into/from the bitstream B, preferably in the slice header.

The number of ranges, the starting order index, the length of the range or the offsets may be encoded/decoded using a simple to parse exp-golomb representation for instance, or another simple to parse variable length code.

It may occur that the encoder cannot determine exactly the bounds of a range of order indexes associated with sensed data from received sensing data. This is the case, for example, when the sensing device sends packets of points that do not correspond to a same number of order indexes and when the sensing device does not send a range of said order indexes with each packet.

In one embodiment of step 110, the size of at least one range of order indexes associated with sensed data of the sensing coverage data SCD may be underestimated, and the size of at least one range of order indexes that is not associated with sensed data of the sensing coverage data SCD may be overestimated.

This embodiment is advantageous when the sensing coverage data SCD is estimated and provided by the encoder 13 of FIG. 13.

Figure 20:
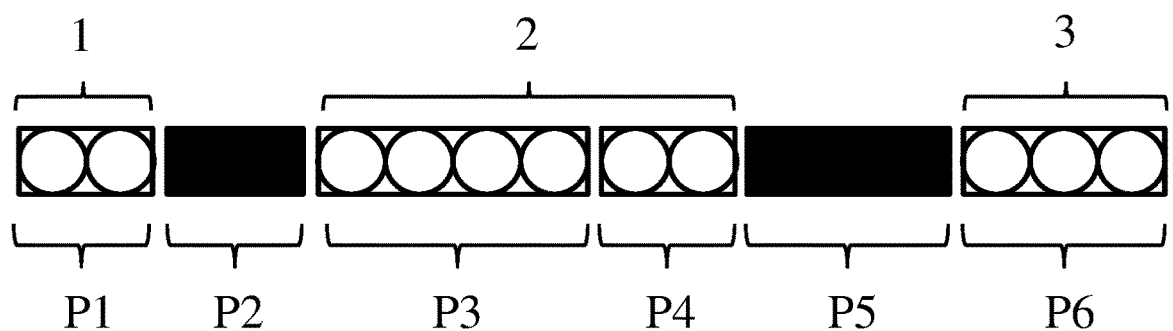
FIG. 20 shows an example of packets sent by a sensing device, as received by an encoder after an unreliable transmission in accordance with at least one embodiment.

As illustrated on FIG. 20, the sensing device 12 sends 5 packets of points P1, P2, P3, P4, P5 and P6 having different sizes (i.e. number of points) and each covering a different and unknown number of order indexes. Also, the sensor does not send any information for order indexes for which no point is detected, it only sends detected points. Second packets P2 and fifth packets P5 are lost during the transmission to the encoder 13. The encoder determines that the second and fourth packets of points (black rectangles) are lost during transmission over the communication channel. The encoder 13 cannot determine and provide an exact sensing coverage data SCD because it does not know the size nor the coverage of each non-received packets (i.e. the encoder 13 does not know the number of order indexes sensed by the sensor for each packet). Then, the encoder underestimates the size of the three ranges of order indexes associated with sensed data of packets P1; P3 and P4; and P6, implying an over-estimate of the size of the range of order indexes that are not associated with sensed data (corresponding to missing packets P2 and P5).

For example, as illustrated, the encoder received a first, a third, a fourth and a sixth packets of points. The encoder determines also that a second and fifth packets of points (black rectangles) are lost (e.g. missing packet numbers in the transmission protocol data). The encoder determines a sensing coverage data SCD that comprises three ranges 1, 2 and 3 of order indexes associated with sensed data. The first range 1 starts with starting order index of the complete sensing cycle, or alternatively an order index associated with sensed data of a first point of the first packet of points P1 and ends with an order index associated with sensed data of the last point of the packet of points P1 i.e. the last point associated with sensed data before the first missing packet of points P2. The second range 2 starts with an order index associated with sensed data of the first point of the third packet of points P3, i.e. the first point associated with sensed data after the missing packet of points P2 and ends with an order index associated with sensed data of the last point of the fourth packet of points P4 i.e. the last point associated with sensed data before the second missing packet of points P5. The third range 3 starts with an order index associated with sensed data of the first point of the sixth packet of points P6, i.e. the first point associated with sensed data after the missing packet of points P5 and ends with ending order index of the complete sensing process, or alternatively an order index associated with sensed data of the last point of the sixth packet of points P6.

The sensor may have started the sensing of the packets on earlier order indexes than the order indexes of the first points in the packets and/or finished the sensing of the packets on later order indexes than the last points in the packets but since it has not detected any objects, it has not provided any point nor information for these order indexes. Thus, this information is not available to the encoder, the three ranges 1, 2 and 3 of order indexes associated with sensing data of the estimated sensing coverage data SCD are then underestimated in comparison to the reality of the sensing (capture).

This embodiment of step 110 ensures that a decision taken by an external analytics taking into account sensing coverage data SCD, for example, will never consider a missing point (due to information loss) as an absence of object (an order index for which no point has been detected), since the encoder don't know exactly the start and the end of sensing ranges (the sensor do not send any information for order indexes for which no point is detected). Indeed it is often preferable to consider that at a given sensor order index, the probing results is unknown, even if the capture/sensor did not detect and provide any point, rather than considering that for a given sensor order index there is no point detected, but for which point state is unknown. In the first case the decision taken by the analytics could be more careful because the status is unknown (e.g. the decision taken is to decelerate a bit or anticipate a potential change of direction . . . until the presence or absence of point in this direction is known), while in the second case the decision taken by the analytics could be more dangerous (e.g. there is no point there, so the decision taken is that the car continue in this direction or even accelerate).

In one embodiment, a flag, denoted geom_may_contain_missing_points_flag for example, may be encoded/decoded into/from the bitstream B, for example in the geometry parameter set, to indicate that between bounds of a range of order indexes that is associated with sensed data, the absence of sensed data associated with a given order index (i.e. the absence of point) is not always reliable, and so that absence of point may be taken more carefully.

In variant, a flag, denoted geom_single_sensing_range_flag for example, may be encoded/decoded into/from the bitstream B, for example in the geometry parameter set or in the sequence parameter set, to indicate if more than one range of order indexes can be present in the sensing coverage data SCD.

This flag can be set to one when the transmission of packets of points between the sensing device and the encoder is reliable or when the loss of packets of points from the sensing device cannot be detected by the encoder. In any case the flag allow to reduce the cost for encoding the sensing coverage data SCD.

In one variant, a flag, denoted geom_sensing_coverage_present_flag for example, may be encoded/decoded into/from the bitstream B, for example in the geometry parameter set, or in the sequence parameter set to indicate if the sensing coverage data SCD is encoded/decoded into/from the bitstream B. If the flag indicates that the sensing coverage data is not provided, the processing relative to the sensing coverage data SCD is disabled and there is no extra coding cost apart from the flag. If the flag indicates that the sensing coverage data SCD is provided, the processing relative to the sensing coverage data SCD is active.

In one embodiment of step 130, encoding/decoding the point cloud geometry data may comprise encoding/decoding an order index difference $\Delta o$ as above discussed. An order index difference $\Delta o$ corresponds to a difference between two successive order indices $o(P_{-1})$ and $o(P)$ where $o(P_{-1})$ and $o(P)$ may belong to a same range of order indexes associated with sensed data of the sensing coverage data SCD or may belong to two successive ranges of the sensing coverage data SCD. If $P_{-1}$ and P belongs to two successive ranges, $\Delta o$ is encoded as $o(P)-o(P_{-1})-N$, where N is the number of order indexes not belonging to any range of order indexes associated with sensed data between the two successive ranges.

In one embodiment of step 120, the sensing coverage data SCD may be encoded/decoded into/from the bitstream B as at least one Supplemental Enhancement Information (SEI) message.

This variant is advantageous because it does not make the sensing coverage data mandatory, and the sensing coverage data could be used with encoder/encoder already deployed. But one drawback is that SEI messages can be discarded, during the transmission (at the transport level for example).

Figure 21:
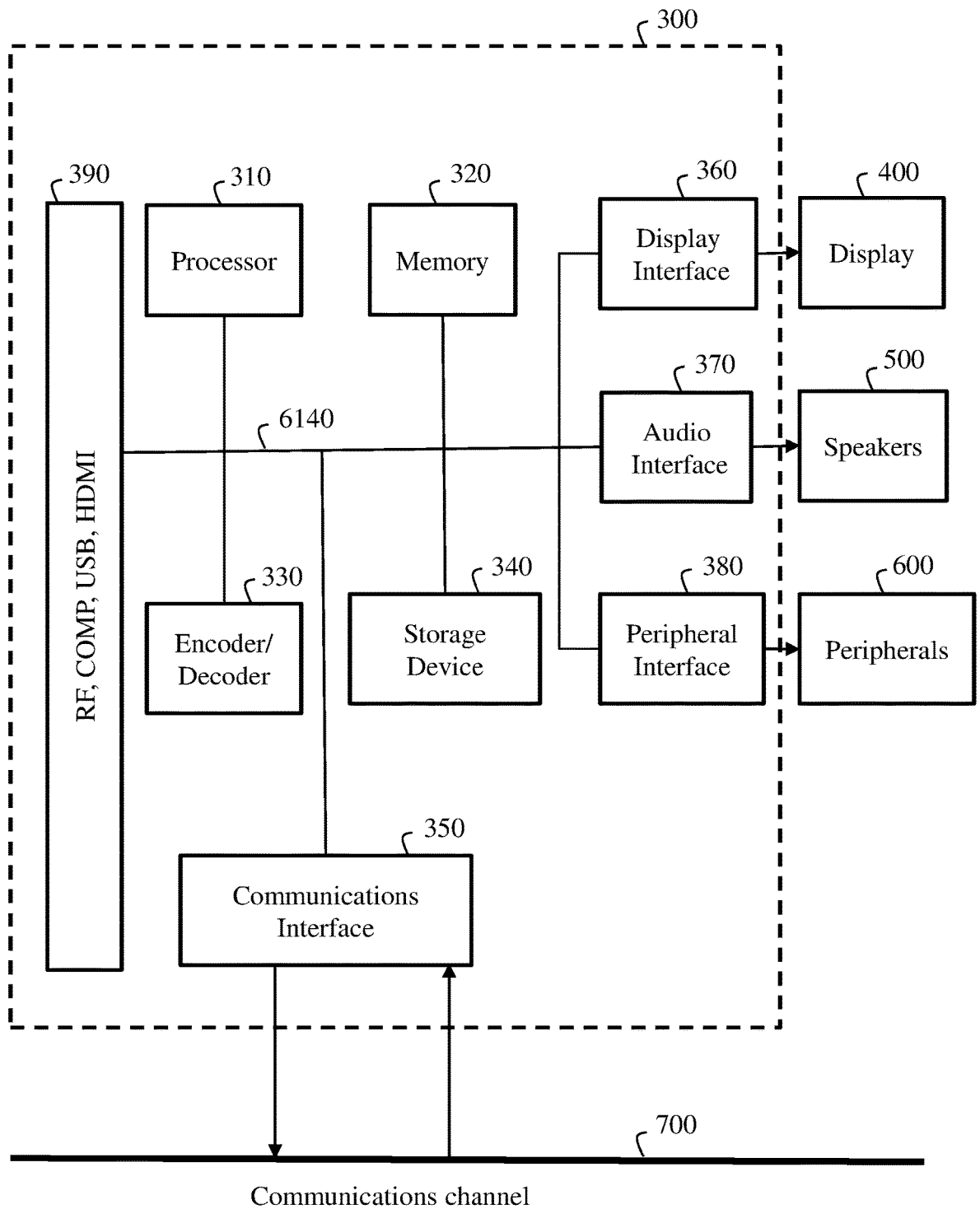
FIG. 21 illustrates a schematic block diagram of an example of a system in which various aspects and embodiments are implemented.

FIG. 21 shows a schematic block diagram illustrating an example of a system in which various aspects and embodiments are implemented.

System 300 may be embedded as one or more devices including the various components described below. In various embodiments, the system 300 may be configured to implement one or more of the aspects described in the disclosure.

Examples of equipment that may form all or part of the system 300 include personal computers, laptops, smartphones, tablet computers, digital multimedia set top boxes, digital television receivers, personal video recording systems, connected home appliances, connected vehicles and their associated processing systems, head mounted display devices (HMD, see-through glasses), projectors (beamers), "caves" (system including multiple displays), servers, video encoders, video decoders, post-processors processing output from a video decoder, pre-processors providing input to a video encoder, web servers, set-top boxes, and any other device for processing a point cloud, a video or an image or other communication devices. Elements of system 300, singly or in combination, may be embodied in a single integrated circuit (IC), multiple ICs, and/or discrete components. For example, in at least one embodiment, the processing and encoder/decoder elements of system 300 may be distributed across multiple ICs and/or discrete components. In various embodiments, the system 300 may be communicatively coupled to other similar systems, or to other electronic devices, via, for example, a communications bus or through dedicated input and/or output ports.

The system 300 may include at least one processor 310 configured to execute instructions loaded therein for implementing, for example, the various aspects described in the disclosure. Processor 310 may include embedded memory, input output interface, and various other circuitries as known in the art. The system 300 may include at least one memory 320 (for example a volatile memory device and/or a non-volatile memory device). System 300 may include a storage device 340, which may include non-volatile memory and/or volatile memory, including, but not limited to, Electrically Erasable Programmable Read-Only Memory (EEPROM), Read-Only Memory (ROM), Programmable Read-Only Memory (PROM), Random Access Memory (RAM), Dynamic Random-Access Memory (DRAM), Static Random-Access Memory (SRAM), flash, magnetic disk drive, and/or optical disk drive. The storage device 340 may include an internal storage device, an attached storage device, and/or a network accessible storage device, as non-limiting examples.

The system 300 may include an encoder/decoder module 330 configured, for example, to process data to provide encoded/decoded point cloud geometry data, and the encoder/decoder module 330 may include its own processor and memory. The encoder/decoder module 330 may represent module(s) that may be included in a device to perform the encoding and/or decoding functions. As is known, a device may include one or both encoding and decoding modules. Additionally, encoder/decoder module 330 may be implemented as a separate element of system 300 or may be incorporated within processor 310 as a combination of hardware and software as known to those skilled in the art.

Program code to be loaded onto processor 310 or encoder/decoder 330 to perform the various aspects described in the disclosure may be stored in storage device 340 and subsequently loaded onto memory 320 for execution by processor 310. In accordance with various embodiments, one or more of processor 310, memory 320, storage device 340, and encoder/decoder module 330 may store one or more of various items during the performance of the processes described in the disclosure. Such stored items may include, but are not limited to, a point cloud frame, encoded/decoded geometry/attributes videos/images or portions of the encoded/decoded geometry/attribute video/images, a bitstream, matrices, variables, and intermediate or final results from the processing of equations, formulas, operations, and operational logic.

In several embodiments, memory inside of the processor 310 and/or the encoder/decoder module 330 may be used to store instructions and to provide working memory for processing that may be performed during encoding or decoding.

In other embodiments, however, a memory external to the processing device (for example, the processing device may be either the processor 310 or the encoder/decoder module 330) may be used for one or more of these functions. The external memory may be the memory 320 and/or the storage device 340, for example, a dynamic volatile memory and/or a non-volatile flash memory. In several embodiments, an external non-volatile flash memory may be used to store the operating system of a television. In at least one embodiment, a fast external dynamic volatile memory such as a RAM may be used as working memory for video coding and decoding operations, such as for MPEG-2 part 2 (also known as ITU-T Recommendation H.262 and ISO/IEC 13818-2, also known as MPEG-2 Video), HEVC (High Efficiency Video coding), VVC (Versatile Video Coding), or MPEG-1 part 5 or part 9.

The input to the elements of system 300 may be provided through various input devices as indicated in block 390. Such input devices include, but are not limited to, (i) an RF portion that may receive an RF signal transmitted, for example, over the air by a broadcaster, (ii) a Composite input terminal, (iii) a USB input terminal, (iv) an HDMI input terminal, (v) a bus such as CAN (Controller Area Network), CAN FD (Controller Area Network Flexible Data-Rate), FlexRay (ISO 17458) or Ethernet (ISO/IEC 802-3) bus when the disclosure is implemented in the automotive domain.

In various embodiments, the input devices of block 390 may have associated respective input processing elements as known in the art. For example, the RF portion may be associated with elements necessary for (i) selecting a desired frequency (also referred to as selecting a signal, or band-limiting a signal to a band of frequencies), (ii) down-converting the selected signal, (iii) band-limiting again to a narrower band of frequencies to select (for example) a signal frequency band which may be referred to as a channel in certain embodiments, (iv) demodulating the down-converted and band-limited signal, (v) performing error correction, and (vi) demultiplexing to select the desired stream of data packets. The RF portion of various embodiments may include one or more elements to perform these functions, for example, frequency selectors, signal selectors, band-limiters, channel selectors, filters, downconverters, demodulators, error correctors, and de-multiplexers. The RF portion may include a tuner that performs various of these functions, including, for example, down-converting the received signal to a lower frequency (for example, an intermediate frequency or a near-baseband frequency) or to baseband.

In one set-top box embodiment, the RF portion and its associated input processing element may receive an RF signal transmitted over a wired (for example, cable) medium. Then, the RF portion may perform frequency selection by filtering, down-converting, and filtering again to a desired frequency band.

Various embodiments rearrange the order of the above-described (and other) elements, remove some of these elements, and/or add other elements performing similar or different functions.

Adding elements may include inserting elements in between existing elements, such as, for example, inserting amplifiers and an analog-to-digital converter. In various embodiments, the RF portion may include an antenna.

Additionally, the USB and/or HDMI terminals may include respective interface processors for connecting system 300 to other electronic devices across USB and/or HDMI connections. It is to be understood that various aspects of input processing, for example, Reed-Solomon error correction, may be implemented, for example, within a separate input processing IC or within processor 310 as necessary. Similarly, aspects of USB or HDMI interface processing may be implemented within separate interface ICs or within processor 310 as necessary. The demodulated, error corrected, and demultiplexed stream may be provided to various processing elements, including, for example, processor 310, and encoder/decoder 330 operating in combination with the memory and storage elements to process the data stream as necessary for presentation on an output device.

Various elements of system 300 may be provided within an integrated housing. Within the integrated housing, the various elements may be interconnected and transmit data therebetween using suitable connection arrangement 390, for example, an internal bus as known in the art, including the I2C bus, wiring, and printed circuit boards.

The system 300 may include communication interface 350 that enables communication with other devices via communication channel 700. The communication interface 350 may include, but is not limited to, a transceiver configured to transmit and to receive data over communication channel 700. The communication interface 350 may include, but is not limited to, a modem or network card and the communication channel 700 may be implemented, for example, within a wired and/or a wireless medium.

Data may be streamed to the system 300, in various embodiments, using a Wi-Fi network such as IEEE 802.11. The Wi-Fi signal of these embodiments may be received over the communications channel 700 and the communications interface 350 which are adapted for Wi-Fi communications. The communications channel 700 of these embodiments may be typically connected to an access point or router that provides access to outside networks including the Internet for allowing streaming applications and other over-the-top communications.

Other embodiments may provide streamed data to the system 300 using a set-top box that delivers the data over the HDMI connection of the input block 390.

Still other embodiments may provide streamed data to the system 300 using the RF connection of the input block 390.

The streamed data may be used as a way for signaling information used by the system 300. The signaling information may comprise the bitstream B and/or information such a number of points of a point cloud, coordinates and/or sensor setup parameters.

It is to be appreciated that signaling may be accomplished in a variety of ways. For example, one or more syntax elements, flags, and so forth may be used to signal information to a corresponding decoder in various embodiments.

The system 300 may provide an output signal to various output devices, including a display 400, speakers 500, and other peripheral devices 600. The other peripheral devices 600 may include, in various examples of embodiments, one or more of a stand-alone DVR, a disk player, a stereo system, a lighting system, and other devices that provide a function based on the output of the system 300.

In various embodiments, control signals may be communicated between the system 300 and the display 400, speakers 500, or other peripheral devices 600 using signaling such as AV.Link (Audio/Video Link), CEC (Consumer Electronics Control), or other communications protocols that enable device-to-device control with or without user intervention.

The output devices may be communicatively coupled to system 300 via dedicated connections through respective interfaces 360, 370, and 380.

Alternatively, the output devices may be connected to system 300 using the communications channel 700 via the communications interface 350. The display 400 and speakers 500 may be integrated in a single unit with the other components of system 300 in an electronic device such as, for example, a television.

In various embodiments, the display interface 360 may include a display driver, such as, for example, a timing controller (T Con) chip.

The display 400 and speaker 500 may alternatively be separate from one or more of the other components, for example, if the RF portion of input 390 is part of a separate set-top box. In various embodiments in which the display 400 and speakers 500 may be external components, the output signal may be provided via dedicated output connections, including, for example, HDMI ports, USB ports, or COMP outputs.

In FIGS. 1-21, various methods are described herein, and each of the methods includes one or more steps or actions for achieving the described method. Unless a specific order of steps or actions is required for proper operation of the method, the order and/or use of specific steps and/or actions may be modified or combined.

Some examples are described with regard to block diagrams and/or operational flowcharts. Each block represents a circuit element, module, or portion of code which includes one or more executable instructions for implementing the specified logical function(s). It should also be noted that in other implementations, the function(s) noted in the blocks may occur out of the indicated order. For example, two blocks shown in succession may, in fact, be executed substantially concurrently or the blocks may sometimes be executed in the reverse order, depending on the functionality involved.

The implementations and aspects described herein may be implemented in, for example, a method or a process, an apparatus, a computer program, a data stream, a bitstream, or a signal. Even if only discussed in the context of a single form of implementation (for example, discussed only as a method), the implementation of features discussed may also be implemented in other forms (for example, an apparatus or computer program).

The methods may be implemented in, for example, a processor, which refers to processing devices in general, including, for example, a computer, a microprocessor, an integrated circuit, or a programmable logic device. Processors also include communication devices.

Additionally, the methods may be implemented by instructions being performed by a processor, and such instructions (and/or data values produced by an implementation) may be stored on a computer readable storage medium. A computer readable storage medium may take the form of a computer readable program product embodied in one or more computer readable medium(s) and having computer readable program code embodied thereon that is executable by a computer. A computer readable storage medium as used herein may be considered a non-transitory storage medium given the inherent capability to store the information therein as well as the inherent capability to provide retrieval of the information therefrom. A computer readable storage medium may be, for example, but is not limited to, an electronic, magnetic, optical, electromagnetic, infrared, or semiconductor system, apparatus, or device, or any suitable combination of the foregoing. It is to be appreciated that the following, while providing more specific examples of computer readable storage mediums to which the present embodiments may be applied, is merely an illustrative and not an exhaustive listing as is readily appreciated by one of ordinary skill in the art: a portable computer diskette; a hard disk; a read-only memory (ROM); an erasable programmable read-only memory (EPROM or Flash memory); a portable compact disc read-only memory (CD-ROM); an optical storage device; a magnetic storage device; or any suitable combination of the foregoing.

The instructions may form an application program tangibly embodied on a processor-readable medium.

Instructions may be, for example, in hardware, firmware, software, or a combination. Instructions may be found in, for example, an operating system, a separate application, or a combination of the two. A processor may be characterized, therefore, as, for example, both a device configured to carry out a process and a device that includes a processor-readable medium (such as a storage device) having instructions for carrying out a process. Further, a processor-readable medium may store, in addition to or in lieu of instructions, data values produced by an implementation.

An apparatus may be implemented in, for example, appropriate hardware, software, and firmware. Examples of such apparatus include personal computers, laptops, smartphones, tablet computers, digital multimedia set top boxes, digital television receivers, personal video recording systems, connected home appliances, head mounted display devices (HMD, see-through glasses), projectors (beamers), "caves" (system including multiple displays), servers, video encoders, video decoders, post-processors processing output from a video decoder, pre-processors providing input to a video encoder, web servers, set-top boxes, and any other device for processing a point cloud, a video or an image or other communication devices. As should be clear, the equipment may be mobile and even installed in a mobile vehicle.

Computer software may be implemented by the processor 310 or by hardware, or by a combination of hardware and software. As a non-limiting example, the embodiments may be also implemented by one or more integrated circuits. The memory 320 may be of any type appropriate to the technical environment and may be implemented using any appropriate data storage technology, such as optical memory devices, magnetic memory devices, semiconductor-based memory devices, fixed memory, and removable memory, as non-limiting examples. The processor 310 may be of any type appropriate to the technical environment, and may encompass one or more of microprocessors, general purpose computers, special purpose computers, and processors based on a multi-core architecture, as non-limiting examples.

As will be evident to one of ordinary skill in the art, implementations may produce a variety of signals formatted to carry information that may be, for example, stored or transmitted. The information may include, for example, instructions for performing a method, or data produced by one of the described implementations. For example, a signal may be formatted to carry the bitstream of a described embodiment. Such a signal may be formatted, for example, as an electromagnetic wave (for example, using a radio frequency portion of spectrum) or as a baseband signal. The formatting may include, for example, encoding a data stream and modulating a carrier with the encoded data stream. The information that the signal carries may be, for example, analog or digital information. The signal may be transmitted over a variety of different wired or wireless links, as is known. The signal may be stored on a processor-readable medium.

The terminology used herein is for the purpose of describing particular embodiments only and is not intended to be limiting. As used herein, the singular forms "a", "an", and "the" may be intended to include the plural forms as well, unless the context clearly indicates otherwise. It will be further understood that the terms "includes/comprises" and/or "including/comprising" when used in this specification, may specify the presence of stated, for example, features, integers, steps, operations, elements, and/or components but do not preclude the presence or addition of one or more other features, integers, steps, operations, elements, components, and/or groups thereof. Moreover, when an element is referred to as being "responsive" or "connected" to another element, it may be directly responsive or connected to the other element, or intervening elements may be present. In contrast, when an element is referred to as being "directly responsive" or "directly connected" to other element, there are no intervening elements present.

It is to be appreciated that the use of any of the symbol/term "/", "and/or", and "at least one of", for example, in the cases of "A/B", "A and/or B" and "at least one of A and B", may be intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as is clear to one of ordinary skill in this and related arts, for as many items as are listed.

Various numeric values may be used in the disclosure. The specific values may be for example purposes and the aspects described are not limited to these specific values.

It will be understood that, although the terms first, second, etc. may be used herein to describe various elements, these elements are not limited by these terms. These terms are only used to distinguish one element from another. For example, a first element could be termed a second element, and, similarly, a second element could be termed a first element without departing from the teachings of this disclosure. No ordering is implied between a first element and a second element.

Reference to "one embodiment" or "an embodiment" or "one implementation" or "an implementation", as well as other variations thereof, is frequently used to convey that a particular feature, structure, characteristic, and so forth (described in connection with the embodiment/implementation) is included in at least one embodiment/implementation. Thus, the appearances of the phrase "in one embodiment" or "in an embodiment" or "in one implementation" or "in an implementation", as well any other variations, appearing in various places throughout this disclosure are not necessarily all referring to the same embodiment.

Similarly, reference herein to "in accordance with an embodiment/example/implementation" or "in an embodiment/example/implementation", as well as other variations thereof, is frequently used to convey that a particular feature, structure, or characteristic (described in connection with the embodiment/example/implementation) may be included in at least one embodiment/example/implementation. Thus, the appearances of the expression "in accordance with an embodiment/example/implementation" or "in an embodiment/example/implementation" in various places in the specification are not necessarily all referring to the same embodiment/example/implementation, nor are separate or alternative embodiment/examples/implementation necessarily mutually exclusive of other embodiments/examples/implementation.

Reference numerals appearing in the claims are by way of illustration only and shall have no limiting effect on the scope of the claims. Although not explicitly described, the present embodiments/examples and variants may be employed in any combination or sub-combination.

When a figure is presented as a flow diagram, it should be understood that it also provides a block diagram of a corresponding apparatus. Similarly, when a figure is presented as a block diagram, it should be understood that it also provides a flow diagram of a corresponding method/process.

Although some of the diagrams include arrows on communication paths to show a primary direction of communication, it is to be understood that communication may occur in the opposite direction to the depicted arrows.

Various implementations involve decoding. "Decoding", as used in this disclosure, may encompass all or part of the processes performed, for example, on a received point cloud frame (including possibly a received bitstream which encodes one or more point cloud frames) in order to produce a final output suitable for display or for further processing in the reconstructed point cloud domain. In various embodiments, such processes include one or more of the processes typically performed by a decoder. In various embodiments, such processes also, or alternatively, include processes performed by a decoder of various implementations described in this disclosure, for example, As further examples, in one embodiment "decoding" may refer only to de-quantizing, in one embodiment "decoding"

may refer to entropy decoding, in another embodiment "decoding" may refer only to differential decoding, and in another embodiment "decoding" may refer to combinations of de-quantizing, entropy decoding and differential decoding. Whether the phrase "decoding process" may be intended to refer specifically to a subset of operations or generally to the broader decoding process will be clear based on the context of the specific descriptions and is believed to be well understood by those skilled in the art.

Various implementations involve encoding. In an analogous way to the above discussion about "decoding", "encoding" as used in this disclosure may encompass all or part of the processes performed, for example, on an input point cloud frame in order to produce an encoded bitstream. In various embodiments, such processes include one or more of the processes typically performed by an encoder. In various embodiments, such processes also, or alternatively, include processes performed by an encoder of various implementations described in this disclosure.

As further examples, in one embodiment "encoding" may refer only to quantizing, in one embodiment "encoding" may refer only to entropy encoding, in another embodiment "encoding" may refer only to differential encoding, and in another embodiment "encoding" may refer to combinations of quantizing, differential encoding and entropy encoding. Whether the phrase "encoding process" may be intended to refer specifically to a subset of operations or generally to the broader encoding process will be clear based on the context of the specific descriptions and is believed to be well understood by those skilled in the art.

Additionally, this disclosure may refer to "obtaining" various pieces of information. Obtaining the information may include one or more of, for example, estimating the information, calculating the information, predicting the information, or retrieving the information from memory.

Further, this disclosure may refer to "accessing" various pieces of information. Accessing the information may include one or more of, for example, receiving the information, retrieving the information (for example, from memory), storing the information, moving the information, copying the information, calculating the information, determining the information, predicting the information, or estimating the information.

Additionally, this disclosure may refer to "receiving" various pieces of information. Receiving is, as with "accessing", intended to be a broad term. Receiving the information may include one or more of, for example, accessing the information, or retrieving the information (for example, from memory). Further, "receiving" is typically involved, in one way or another, during operations such as, for example, storing the information, processing the information, transmitting the information, moving the information, copying the information, erasing the information, calculating the information, determining the information, predicting the information, or estimating the information.

Also, as used herein, the word "signal" refers to, among other things, indicating something to a corresponding decoder. For example, in certain embodiments the encoder signals a particular information such a number of points of the point cloud or coordinates or sensor setup parameters. In this way, in an embodiment the same parameter may be used at both the encoder side and the decoder side. Thus, for example, an encoder may transmit (explicit signaling) a particular parameter to the decoder so that the decoder may use the same particular parameter. Conversely, if the decoder already has the particular parameter as well as others, then signaling may be used without transmitting (implicit signaling) to simply allow the decoder to know and select the particular parameter. By avoiding transmission of any actual functions, a bit savings is realized in various embodiments. It is to be appreciated that signaling may be accomplished in a variety of ways. For example, one or more syntax elements, flags, and so forth are used to signal information to a corresponding decoder in various embodiments. While the preceding relates to the verb form of the word "signal", the word "signal" may also be used herein as a noun.

A number of implementations have been described. Nevertheless, it will be understood that various modifications may be made. For example, elements of different implementations may be combined, supplemented, modified, or removed to produce other implementations. Additionally, one of ordinary skill will understand that other structures and processes may be substituted for those disclosed and the resulting implementations will perform at least substantially the same function(s), in at least substantially the same way(s), to achieve at least substantially the same result(s) as the implementations disclosed. Accordingly, these and other implementations are contemplated by this disclosure.

The invention claimed is:

1. A method of encoding, into a bitstream, point cloud geometry data sensed by at least one sensor associated with a sensor index, the point cloud geometry data being represented by ordered coarse points occupying some discrete positions of a set of discrete positions of a two-dimensional space, each coarse point being located within the two-dimensional space by an order index defined from a sensor index associated with a sensor that is able to sense a point of the point cloud represented by the coarse point and a sample index associated with a sensing time instant at which the point of the point cloud is sensed, wherein the method comprises:
   obtaining sensing coverage data (SCD) representative of at least one range of order indexes associated with sensed data; and
   encoding the sensing coverage data (SCD) into the bitstream.

2. The method of claim 1, wherein the method further comprises encoding the point cloud geometry data into the bitstream.

3. The method of claim 2, wherein encoding the point cloud geometry data into the bitstream is based on the sensing coverage data (SCD).

4. A method of decoding, from a bitstream, point cloud geometry data sensed by at least one sensor associated with a sensor index, the point cloud geometry data being represented by ordered coarse points occupying some discrete positions of a set of discrete positions of a two-dimensional space, each coarse point being located within the two-dimensional space by an order index defined from a sensor index associated with a sensor that is able to sense a point of the point cloud represented by the coarse point and a sample index associated with a sensing time instant at which the point of the point cloud is sensed, wherein the method comprises decoding sensing coverage data (SCD) from the bitstream.

5. The method of claim 4, wherein the method further comprises decoding the point cloud geometry data from the bitstream.

6. The method of claim 5, wherein decoding the point cloud geometry data from the bitstream is based on the sensing coverage data (SCD).

7. The method of claim 1, wherein each range of order indexes of the sensing coverage data (SCD) is delimited by a lower bound (LB) of order indexes and an upper bound (UB) of order indexes.

8. The method of claim 7, wherein the lower bound (LB) and the upper bound (UB) are encoded/decoded into/from the bitstream as a starting order index(S) and a number (M) of order indexes.

9. The method of claim 1, wherein a flag is encoded/decoded into/from the bitstream to indicate if more than one range of order indexes can be present in the sensing coverage data (SCD).

10. An apparatus of encoding, into a bitstream, point cloud geometry data sensed by at least one sensor associated with a sensor index, the point cloud geometry data being represented by ordered coarse points occupying some discrete positions of a set of discrete positions of a two-dimensional space, each coarse point being located within the two-dimensional space by an order index defined from a sensor index associated with a sensor that is able to sense a point of the point cloud represented by the coarse point and a sample index associated with a sensing time instant at which the point of the point cloud is sensed,
wherein the apparatus comprises a processor configured to:
obtain sensing coverage data (SCD) representative of at least one range of order indexes associated with sensed data; and
encode the sensing coverage data (SCD) into the bitstream.

11. An apparatus of decoding a point cloud from a bitstream of encoded point cloud data, the apparatus comprising a processor configured to perform the method of claim 4.

12. A non-transitory storage medium carrying instructions of program code for executing the method of claim 1.

13. The method of claim 4, wherein each range of order indexes of the sensing coverage data (SCD) is delimited by a lower bound (LB) of order indexes and an upper bound (UB) of order indexes.

14. The method of claim 13, wherein the lower bound (LB) and the upper bound (UB) are encoded/decoded into/from the bitstream as a starting order index(S) and a number (M) of order indexes.

15. The method of claim 4, wherein a flag is encoded/decoded into/from the bitstream to indicate if more than one range of order indexes can be present in the sensing coverage data (SCD).

16. The apparatus of claim 10, wherein the processor is further configured to encode the point cloud geometry data into the bitstream.

17. The apparatus of claim 16, wherein the point cloud geometry data is encoded into the bitstream based on the sensing coverage data (SCD).

18. The apparatus of claim 10, wherein each range of order indexes of the sensing coverage data (SCD) is delimited by a lower bound (LB) of order indexes and an upper bound (UB) of order indexes.

19. A non-transitory storage medium carrying instructions of program code for executing the method of claim 4.

* * * * *